United States Patent
Ohba

(10) Patent No.: US 8,587,050 B2
(45) Date of Patent: Nov. 19, 2013

(54) SEMICONDUCTOR MEMORY

(75) Inventor: Ryuji Ohba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/419,930

(22) Filed: Mar. 14, 2012

(65) Prior Publication Data

US 2012/0235219 A1 Sep. 20, 2012

(30) Foreign Application Priority Data

Mar. 16, 2011 (JP) .................................. 2011-058316

(51) Int. Cl.
*H01L 29/788* (2006.01)

(52) U.S. Cl.
USPC .................... 257/315; 257/E29.309; 438/261; 365/185.28

(58) Field of Classification Search
USPC .......................... 257/315, E29.309; 438/261; 365/185.28
See application file for complete search history.

(56) References Cited

U.S. PATENT DOCUMENTS

| | | | |
|---|---|---|---|
| 7,393,745 B2 * | 7/2008 | Jeng ............................... | 438/257 |
| 2003/0132432 A1 * | 7/2003 | Yoshii et al. .................... | 257/17 |
| 2007/0045711 A1 * | 3/2007 | Bhattacharyya .............. | 257/315 |
| 2009/0097320 A1 * | 4/2009 | Min et al. ................. | 365/185.18 |
| 2009/0302365 A1 * | 12/2009 | Bhattacharyya .............. | 257/298 |

FOREIGN PATENT DOCUMENTS

| | | |
|---|---|---|
| JP | 10-256403 | 9/1998 |
| JP | 2002-289709 | 10/2002 |
| JP | 2002-289710 | 10/2002 |
| JP | 2003-78050 | 3/2003 |
| JP | 2003-318293 | 11/2003 |
| JP | 3512975 | 1/2004 |
| KR | 10-2008-0072348 | 8/2008 |
| WO | WO 2010/101027 A1 | 9/2010 |
| WO | WO 2011/036775 A1 | 3/2011 |

OTHER PUBLICATIONS

U.S. Appl. No. 13/225,025, filed Sep. 2, 2011, Ryuji Ohba.
U.S. Appl. No. 13/427,587, filed Mar. 22, 2012, Ohba, et al.
U.S. Appl. No. 13/426,842, filed Mar. 22, 2012, Ohba.
Korean Office Action mailed Jul. 25, 2013, in Korean Patent Application No. 10-2012-0027125 (with English Translation).

* cited by examiner

*Primary Examiner* — Steven J Fulk

(74) *Attorney, Agent, or Firm* — Oblon, Spivak, McClelland, Maier & Neustadt, L.L.P.

(57) ABSTRACT

In one embodiment, there is provided a semiconductor memory that includes: a semiconductor substrate having a channel region; a first tunnel insulating film on the channel region; a first fine particle layer on the first tunnel insulating film, the first fine particle layer including first conductive fine particles; a second tunnel insulating film on the first fine particle layer; a second fine particle layer on the second tunnel insulating film, the second fine particle layer including second conductive fine particles; a third tunnel insulating film on the second fine particle layer; a third fine particle layer on the third tunnel insulating film, the third fine particle layer including third conductive fine particles. A mean particle diameter of the second conductive fine particles is larger than that of the first conductive fine particles and that of the third conductive fine particles.

10 Claims, 20 Drawing Sheets

ΔEeFF BECOMES HIGH AT
CHARGE STORAGE/HOLDING.

ΔEeff AT WRITING IS
REDUCED WITH
Fcw = (ΔE2 − ΔE1)/
qTox3 AS BOUNDARY.

ΔEeff AT WRITING IS
REDUCED WITH
Fcw = (ΔE2 − ΔE1)/
qTox3 AS BOUNDARY.

ΔEeff BECOMES HIGH AT CHARGE STORAGE/HOLDING.

ΔEeff AT WRITING IS REDUCED WITH
Fcw=(ΔE2−ΔE1)/qTox3 AS BOUNDARY.

ΔEeff BECOMES HIGH AT
CHARGE STORAGE/HOLDING.

$\Delta Eeff$ AT WRITING IS REDUCED WITH
$Fcw=(\Delta E2-\Delta E1)/qTox3$ AS BOUNDARY.

SEMICONDUCTOR MEMORY

This application claims priority from Japanese Patent Application No. 2011-058316, filed on Mar. 16, 2011, the entire contents of which are hereby incorporated by reference.

BACKGROUND

1. Field

Embodiments described herein relate to a semiconductor memory.

2. Description of the Related Art

A semiconductor memory in which fine particle layer containing conductive fine particles such as silicon microcrystals is inserted in a tunnel insulating film has been developed as a progressive type of MONOS (Metal Oxide Nitride Oxide Semiconductor) memory. In this semiconductor memory, such a double tunnel junction that silicon microcrystals satisfying a Coulomb blockade condition are sandwiched between tunnel insulating films is used so that electric charge can be taken in and out due to a tunneling current between a silicon surface and a trap level in a silicon nitride film (charge storage film).

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1A:
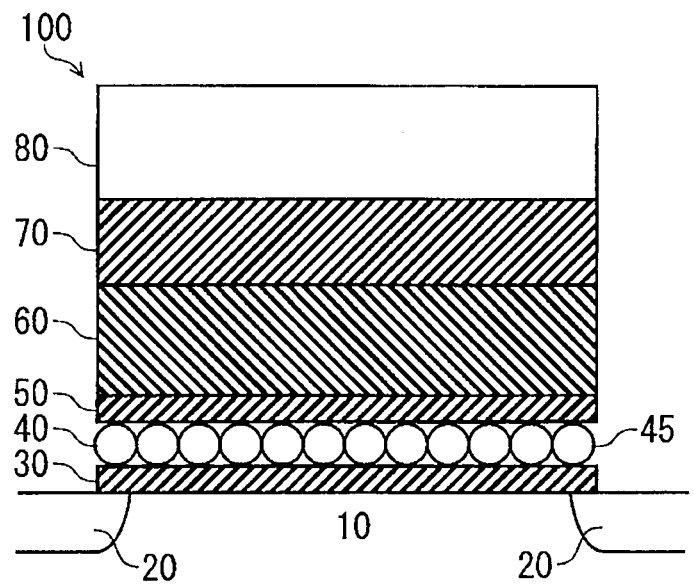
FIG. 1A is a view showing a semiconductor memory.

According to an embodiment, there is provided a semiconductor memory. The semiconductor memory includes: a semiconductor substrate having a channel region; a first tunnel insulating film formed on the channel region of the semiconductor substrate; a first fine particle layer formed on the first tunnel insulating film, the first fine particle layer comprising a plurality of first conductive fine particles that meet a Coulomb blockade condition; a second tunnel insulating film formed on the first fine particle layer; a second fine particle layer formed on the second tunnel insulating film, the second fine particle layer comprising a plurality of second conductive fine particles that meet the Coulomb blockade condition, wherein a mean particle diameter of the second conductive fine particles is larger than that of the first conductive fine particles; a third tunnel insulating film formed on the second fine particle layer; a third fine particle layer formed on the third tunnel insulating film, the third fine particle layer comprising a plurality of third conductive fine particles that meet the Coulomb blockade condition, wherein a mean particle diameter of the third conductive fine particles is smaller than that of the second conductive fine particles; a fourth tunnel insulating film formed on the third fine particle layer; a charge storage film formed on the fourth tunnel insulating film; a block insulating film formed on the charge storage film; and a gate electrode formed on the block insulating film.

Exemplary embodiments of the invention will be described below with reference the drawings. The same units, sections, or the like in the drawings will be given the same reference symbol and will not be described redundantly. Incidentally, the drawings are so typical or conceptual that the relation between the thickness and width of each part, the factor of proportionality between sizes of parts, etc. are not always equal to actual values. Even when two parts are the same, the two parts may be expressed so as to be different in size and factor of proportionality in accordance with the drawings.

A semiconductor memory using an energy barrier $\Delta E$ due to the Coulomb blockade effect and quantum confinement will be described hereinafter.

FIG. 1A is a view showing a semiconductor memory 100.

The semiconductor memory 100 has source/drain regions 20 formed in a semiconductor substrate 10, a tunnel insulating film 30 formed on a surface of the semiconductor substrate 10, a silicon layer 45 formed on the tunnel insulating film 30, a tunnel insulating film 50 formed on the silicon layer 45, a charge storage film 60 formed on the tunnel insulating film 50, a block insulating film 70 formed on the charge storage film 60, and a gate electrode 80 formed on the block insulating film 70.

The semiconductor substrate 10 is made of a P-type silicon substrate. The semiconductor substrate 10 may be a semiconductor layer. In this case, the semiconductor layer is made of a P-type silicon layer.

The tunnel insulating film 30 is formed in such a manner that a substrate surface of the semiconductor substrate 10 is thermally oxidized. The thickness of the tunnel insulating film 30 is about 1 nm.

The silicon layer 45 contains conductive fine particles 40. The silicon layer 45 is formed by CVD (Chemical Vapor Deposition) or the like. The thickness of the silicon layer 45 is about 1.5 nm. For example, the conductive fine particles 40 are silicon (Si) microcrystals.

The thickness of the tunnel insulating film 50 is about 1 nm.

The charge storage film 60 is made of a silicon nitride film ($Si_3N_4$). The thickness of the charge storage film 60 is about 5 nm. A floating gate electrode such as polysilicon may be used as the charge storage film 60.

The thickness of the block insulating film 70 is about 6 nm.

The gate electrode 80 is made of $n^+$ polysilicon.

The semiconductor memory 100 uses a double tunnel junction which is formed in such a manner that the silicon layer 45 containing conductive fine particles 40 satisfying a Coulomb blockade condition is sandwiched between the tunnel insulating films 30 and 50. The double tunnel junction permits electrons to be taken in and out due to a tunneling phenomenon between a surface of the semiconductor substrate 10 and a trap level in the charge storage film 60. The Coulomb blockade condition means that the charging energy of one electron is larger than the thermal fluctuation energy.

To take electrons into the trap level in the charge storage film 60, a positive voltage is applied to the gate electrode 80. When a positive voltage is applied to the gate electrode 80, an inversion layer of carrier electrons is formed in the semiconductor substrate 10. The carrier electrons are injected into the trap level in the charge storage film 60 due to a tunneling current through the tunnel insulating films 30 and 50 between which the silicon layer 45 is sandwiched.

To read information, reduction of a drain current caused by electric field shielding between the gate electrode 80 and the inversion layer, which is due to charges trapped in the charge storage film 60, is measured. To release electrons from the charge storage film 60, a negative voltage is applied to the gate electrode 80. When a negative voltage is applied to the gate electrode 80, electrons trapped in the charge storage film 80 flow into the semiconductor substrate 10 via the tunnel insulating films 30 and 50.

Figure 1B:
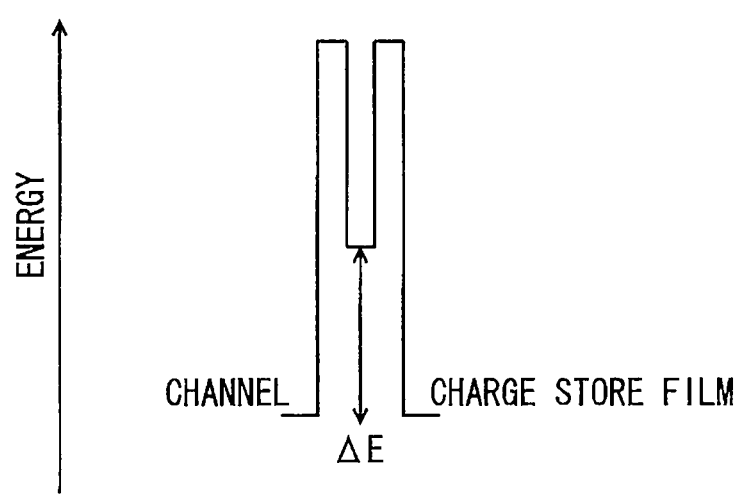
FIG. 1B is a view for explaining the principle of operation of the semiconductor memory.

FIG. 1B shows an energy band diagram of the semiconductor memory 100 in a state where electric charge is held. As shown in FIG. 1B, the energy barrier $\Delta E$ due to the Coulomb blockade effect and quantum confinement in the conductive microcrystals 40 blocks the passage of electric charge held in the conductive storage film 60. Consequently, charge retention characteristic can be improved in accordance with an exponential function $\exp(\Delta E/k_B T)$ in which $k_B$ is the Boltzmann constant, and T is an absolute temperature (K). Considering the operating temperature of the semiconductor memory (NAND flash), T is in a range of 233K to 353K, both inclusively. Generally, T is often regarded as the room temperature of 300K. To improve charge retention, it is necessary to reduce the particle diameter of silicon microcrystals to raise the energy barrier $\Delta E$. Higher-grade control of variations in particle diameter is required as the particle diameter becomes smaller.

Figure 1C:
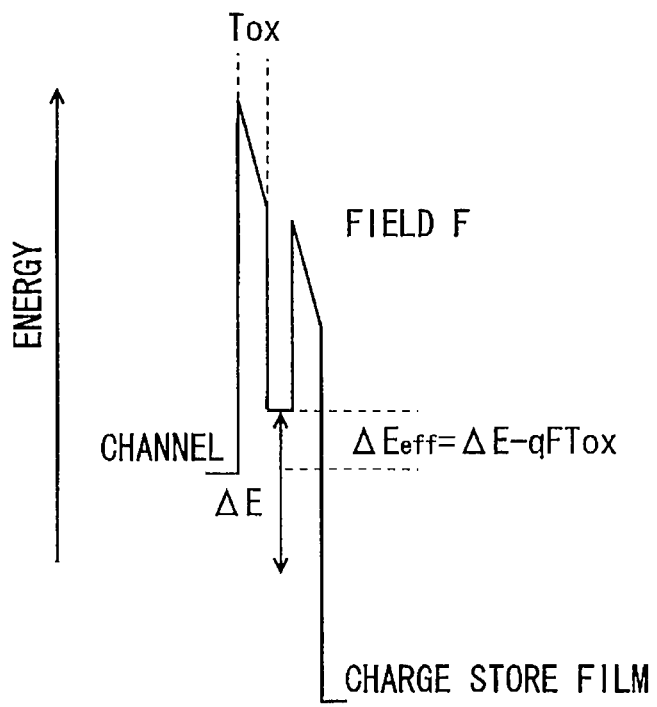
FIG. 1C is a view for explaining the principle of operation of the semiconductor memory.

FIG. 1C shows an energy band diagram of the semiconductor memory 100 in a state where information is written/erased. As shown in FIG. 1C, the influence of the energy barrier $\Delta E$ can be reduced when an appropriate writing/erasing voltage is applied to the gate electrode 80. Accordingly, electrons which serve as a carrier of information can tunnel through, so that high-speed writing/erasing can be made. A tunnel electric field F is applied to the semiconductor memory 100. When a tunneling electric field F is applied, the tunneling current density changes as (resistance of the tunnel insulating film 30)$^{-1}\cdot\exp[-(\Delta E - q \cdot T_{OX} \cdot F)/k_B T]$. This is because the effective energy barrier is $\Delta E - q \cdot T_{OX} \cdot F$ as shown in FIG. 1C. $T_{OX}$ shows the thickness of the tunnel insulating film 30, F shows the tunneling electric field, $\Delta E$ shows the energy barrier, and q shows the elementary electric charge. It is found from the above description that the tunneling current density increases exponentially in accordance with constant×exp $[(q \cdot T_{OX}/k_B T) \cdot F]$ as the tunneling electric field F changes. To make consistency of charge retention and high-speed writing/erasing advantageous, it is necessary that the tunneling current density becomes lower in a low electric field to make charge retention advantageous, and that the current density becomes higher in a high electric field to make writing/erasing advantageous. It is therefore preferable that the current increases more greatly than constant×$\exp[(q \cdot T_{OX}/k_B T) \cdot F]$ as the electric field F increases.

Figure 1D:
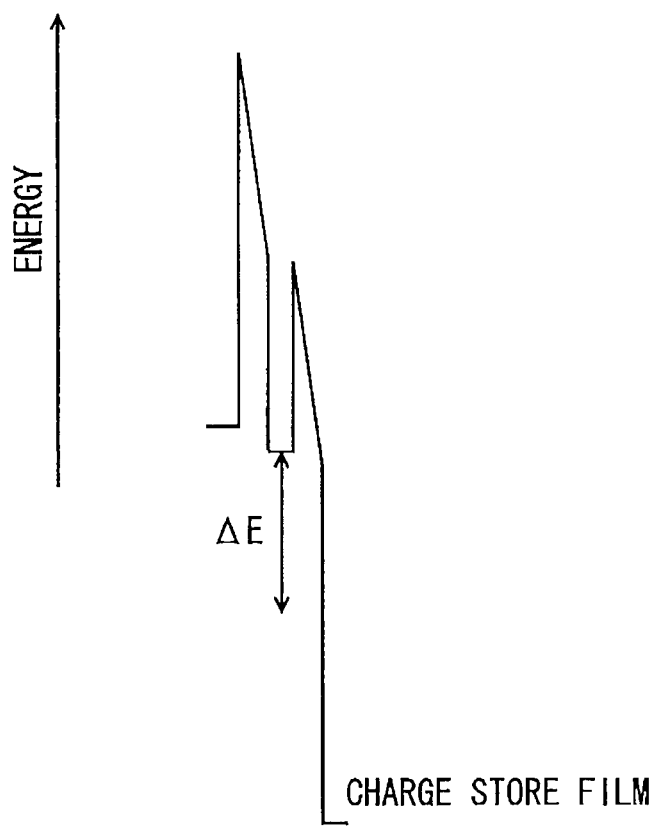
FIG. 1D is a view for explaining the principle of operation of the semiconductor memory.

FIG. 1D shows an energy band diagram of the semiconductor memory 100 in a state where the tunneling electric field F becomes higher than that in FIG. 1C. As shown in FIG. 1D, the influence of the energy barrier $\Delta E$ is reduced when the tunneling electric field F becomes higher. Accordingly, higher-speed writing/erasing can be made.

As the particle diameter of the conductive fine particles 40 becomes smaller, the energy barrier $\Delta E$ due to the Coulomb blockade effect and quantum confinement becomes higher. Accordingly, charge retention characteristic can be improved while high-speed writing/erasing can be kept. When the particle diameter of the conductive fine particles 40 is reduced, the energy barrier $\Delta E$ becomes so high that charge retention time can be improved exponentially. The speed of writing/erasing can be kept equal to the speed in the case where the tunnel insulating film is a 1 nm-thick silicon oxide film. When the energy barrier $\Delta E$ is raised so that charge retention can be improved without reduction in particle diameter, difficult control of variations in particle diameter can be avoided preferably. When increase of the tunneling current with increase of the tunneling electric field is larger, high-speed writing/erasing can be made in a lower voltage preferably.

First Exemplary Embodiment

Figure 2A:
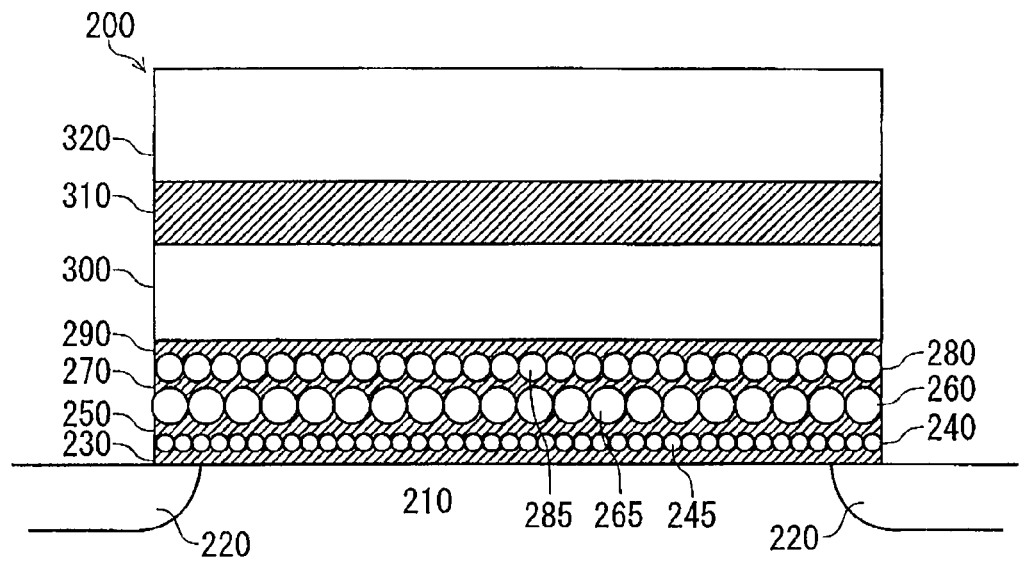
FIG. 2A is a view showing a semiconductor memory according to a first exemplary embodiment.

FIG. 2A is a view showing a semiconductor memory 200. The semiconductor memory 200 has a semiconductor substrate 210, source/drain regions 220 formed in the semiconductor substrate 210, a first tunnel insulating film 230 formed on a channel region between the source/drain regions 220, a first fine particle layer 240 formed on the first tunnel insulating film 230, a second tunnel insulating film 250 formed on the first fine particle layer 240, a second fine particle layer 260 formed on the second tunnel insulating film 250, a third tunnel insulating film 270 formed on the second fine particle layer 260, a third fine particle layer 280 formed on the third tunnel insulating film 270, a fourth tunnel insulating film 290 formed on the third fine particle layer 280, a charge storage film 300 formed on the fourth tunnel insulating film 290, a block insulating film 310 formed on the charge storage film 300, and a gate electrode 320 formed on the block insulating film 310.

A silicon substrate may be used as the semiconductor substrate 210.

Silicon oxide may be used as the first tunnel insulating film 230, the second tunnel insulating film 250, the third tunnel insulating film 270, the fourth tunnel insulating film 290 and the block insulating film 310. The thickness of each of the first tunnel insulating film 230, the second tunnel insulating film 250, the third tunnel insulating film 270 and the fourth tunnel insulating film 290 may be uniform.

The first fine particle layer 240 contains first conductive fine particles 245 satisfying a Coulomb blockade condition. A layer crystallized by heating amorphous silicon (a-Si) may be used as the first fine particle layer 240. Silicon nanocrystal may be used as the first conductive fine particles 245.

The second fine particle layer 260 contains second conductive fine particles 265 satisfying a Coulomb blockade condition. A layer crystallized by heating a-Si may be used as the second fine particle layer 260. Silicon nanocrystal may be used as the second conductive fine particles 265.

The third fine particle layer 280 contains third conductive fine particles 285 satisfying a Coulomb blockade condition. A layer crystallized by heating a-Si may be used as the second fine particle layer 280. Silicon nanocrystal may be used as the second conductive fine particles 285.

The mean particle diameter of the second conductive fine particles 265 is larger than the mean particle diameters of the first conductive fine particles 245 and the third conductive fine particles 285. The particle diameter of each of the first conductive fine particles 245, the second conductive fine particles 265 and the third conductive fine particles 285 may be uniform.

A polysilicon or silicon nitride film may be used as the charge storage film 300. When a silicon nitride film is used as the charge storage film 300, the thickness of the charge storage film 300 is about 5 nm.

n$^+$ polysilicon may be used as the gate electrode 320.

Figure 2B:
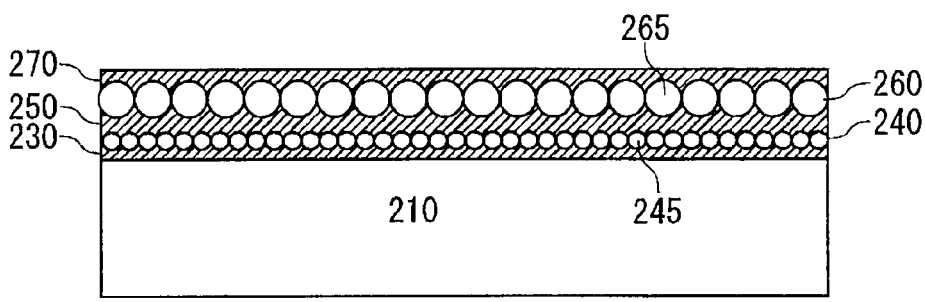
FIG. 2B is a view showing the semiconductor memory according to the first exemplary embodiment.

A method of producing the semiconductor memory 200 will be described with reference to FIGS. 2B and 2C.

A thermally grown silicon oxide film 230 with a thickness ($T_{OX}$) of 1 nm is formed on a silicon substrate 210. A 1.5 nm-thick a-Si layer is deposited on the thermally grown silicon oxide film 230 by a CVD apparatus. Then, a silicon oxide film 250 with a thickness of 1 nm is formed on a surface of the a-Si layer by thermal oxidation. As a result, the thickness of the a-Si layer becomes 1 nm, so that the a-Si layer is sandwiched between the 1 nm-thick silicon oxide films. Then, the a-Si layer is annealed in a nitrogen atmosphere at a high temperature of 950° C. to thereby form a silicon layer 240 containing a group of silicon microcrystals 245 with substantially the same thickness as the thickness of the a-Si layer. A 2.5 nm-thick a-Si layer is deposited on the silicon layer 240 by a CVD apparatus. Then, a 1 nm-thick silicon oxide film 250 is formed on a surface of the a-Si layer by thermal oxidation. As a result, the thickness of the a-Si layer becomes 2 nm, so that the a-Si layer is sandwiched between the 1 nm-thick silicon oxide films. Then, the a-Si layer is annealed in a nitrogen atmosphere at a high temperature of 950° C. to thereby form a silicon layer 260 containing a group of silicon microcrystals 265 with substantially the same thickness as the thickness of the a-Si layer (see FIG. 2B).

A 2 nm-thick a-Si layer is deposited on the silicon layer 260 by a CVD apparatus. Then, a 1 nm-thick silicon oxide film 270 is formed on a surface of the a-Si layer by thermal oxidation. As a result, the thickness of the a-Si layer becomes 1.5 nm, so that the a-Si layer is sandwiched between the 1 nm-thick silicon oxide films. Then, the a-Si layer is annealed in a nitrogen atmosphere at a high temperature of 950° C. to thereby form a silicon layer 280 containing a group of silicon microcrystals 285 with substantially the same thickness as the thickness of the a-Si layer. Incidentally, the annealing condition in the nitrogen atmosphere can be adjusted to control the particle diameter of each of the silicon microcrystals 245, 265 and 285 to be substantially equal to the thickness of the a-Si layer. There are two reasons. The first reason is that the a-Si layer is too thin to allow horizontal crystal growth. The second reason is that silicon microcrystals have a tendency to hold a crystalline state in which surface energy is minimized.

Figure 2C:
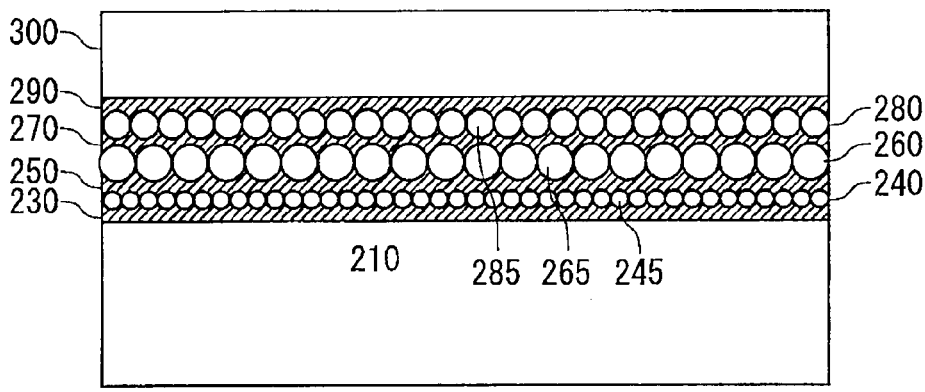
FIG. 2C is a view showing the semiconductor memory according to the first exemplary embodiment.

Then, a polysilicon film 300 (charge storage film) with a thickness of 10 nm is formed on the silicon layer 280 by LPCVD (see FIG. 2C).

A silicon oxide film 310 with a thickness of 10 nm is formed on the polysilicon film 300 by LPCVD. An n$^+$ polysilicon layer 320 (gate electrode) with a thickness of 200 nm is formed on the silicon oxide film 310. Then, a resist pattern is used as a mask so that the n$^+$ polysilicon layer 320 is shaped into a gate electrode. Then, phosphorus is implanted at incident energy of 5 KeV at a dose of $1 \times 10^{15}$ cm$^{-2}$ and annealing is performed at 1000° C. for 10 seconds to form an n$^+$ layer 220 which serves as source/drain regions (see FIG. 2A).

The principle of operation of the semiconductor memory 200 will be described.

FIGS. 3A to 3D are views for explaining the principle of operation of the semiconductor memory 200.

The energy barrier $\Delta E$ due to the Coulomb blockade effect and quantum confinement in conductive fine particles becomes high as the particle diameter of the conductive fine particles becomes small. Accordingly, $\Delta E$ of the first conductive fine particles 245 is higher than $\Delta E_1$ of the second conductive fine particles 265 and $\Delta E_2$ of the third conductive fine particles 285. $\Delta E_1$ of the second conductive fine particles 265 is lower than $\Delta E$ of the first conductive fine particles 245 and $\Delta E_2$ of the third conductive fine particles 285. $\Delta E_2$ of the third conductive fine particles 285 takes a size between $\Delta E$ of the first conductive fine particles 245 and $\Delta E_1$ of the second conductive fine particles 265 (see FIG. 3A).

Because the second fine particle layer 260 has the lowest energy barrier as described above, electrons remain in the second fine particle layer 260 after writing/erasing. At writing/erasing, electrons are taken in and out via the respective fine particle layers. For this reason, electrons located in the fine particle layers go out in pursuit of a lower energy state just after writing/erasing. Electrons located in the first fine particle layer 240 go out to the channel region or the second fine particle layer 260 immediately. Electrons located in the third fine particle layer 280 go out to the charge storage film 300 or the central second fine particle layer 260. However, electrons located in the second fine particle layer 260 are in a lower energy state than the energy state on both sides. Accordingly, electrons are located in the second fine particle layer 260 for a long term.

Figure 3A:
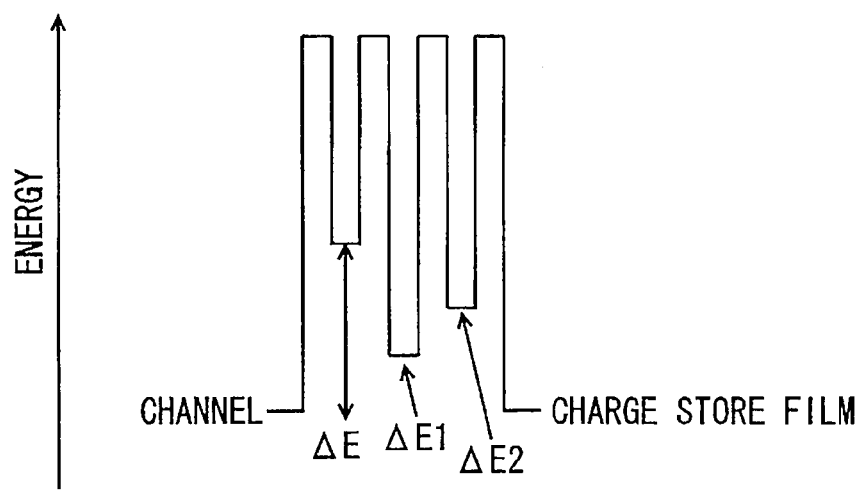
FIG. 3A is a view for explaining the principle of operation of the semiconductor memory according to the first exemplary embodiment.
Figure 3B:
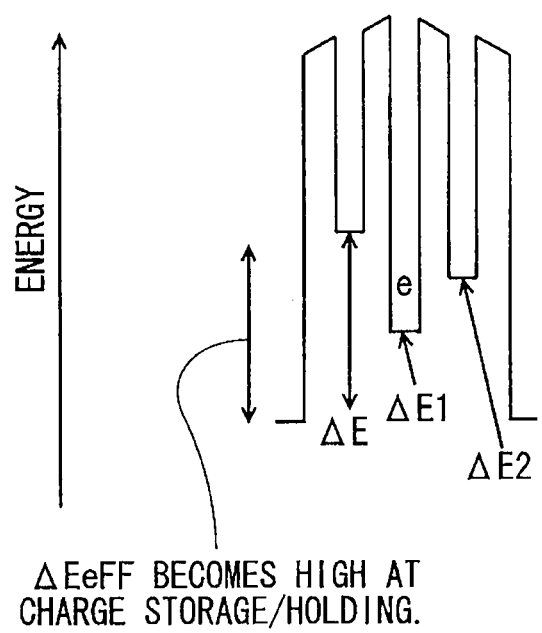
FIG. 3B is a view for explaining the principle of operation of the semiconductor memory according to the first exemplary embodiment.
Figure 3C:
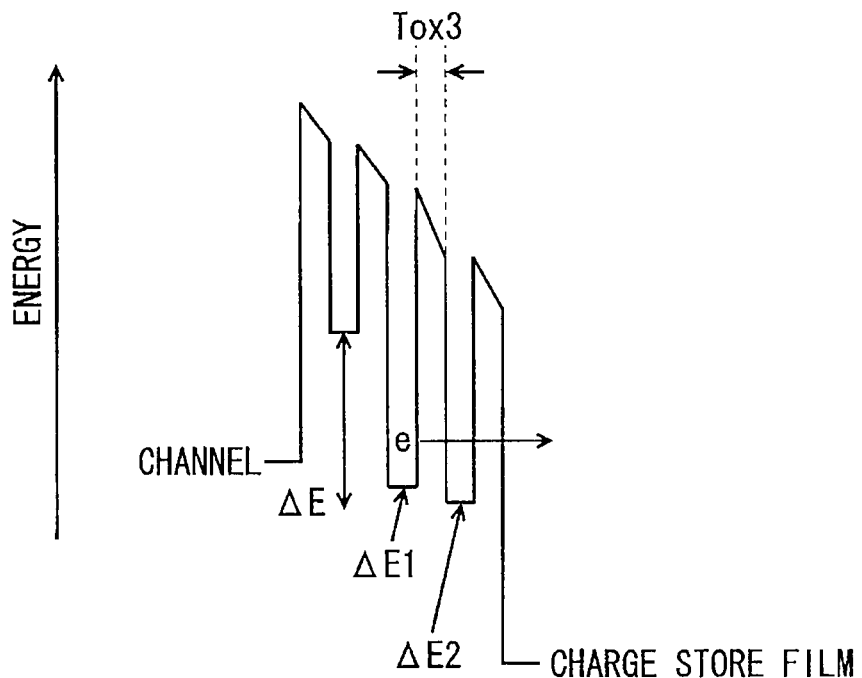
FIG. 3C is a view for explaining the principle of operation of the semiconductor memory according to the first exemplary embodiment.
Figure 3D:
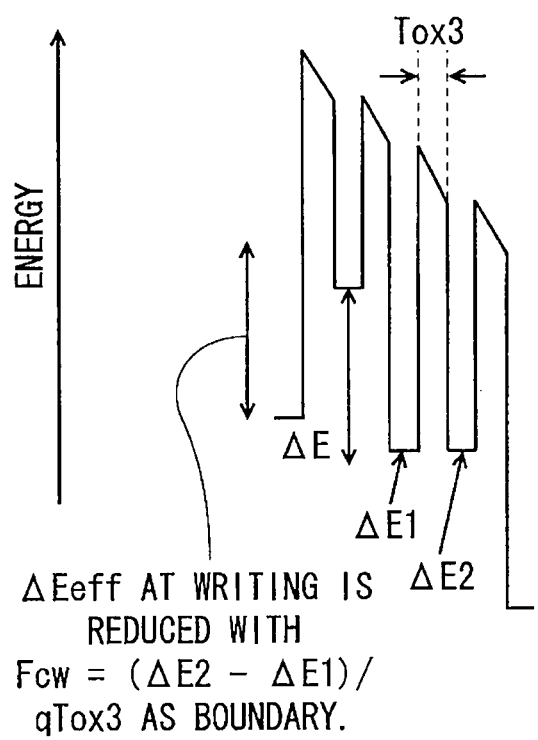
FIG. 3D is a view for explaining the principle of operation of the semiconductor memory according to the first exemplary embodiment.

As a result, potential of the second fine particle layer 260 increases as shown in FIG. 3B. Accordingly, the height of the energy barrier increases effectively when electric charge is stored. Accordingly, charge retention characteristic is improved exponentially without reduction in particle diameter of the conductive fine particles.

Figure 4:
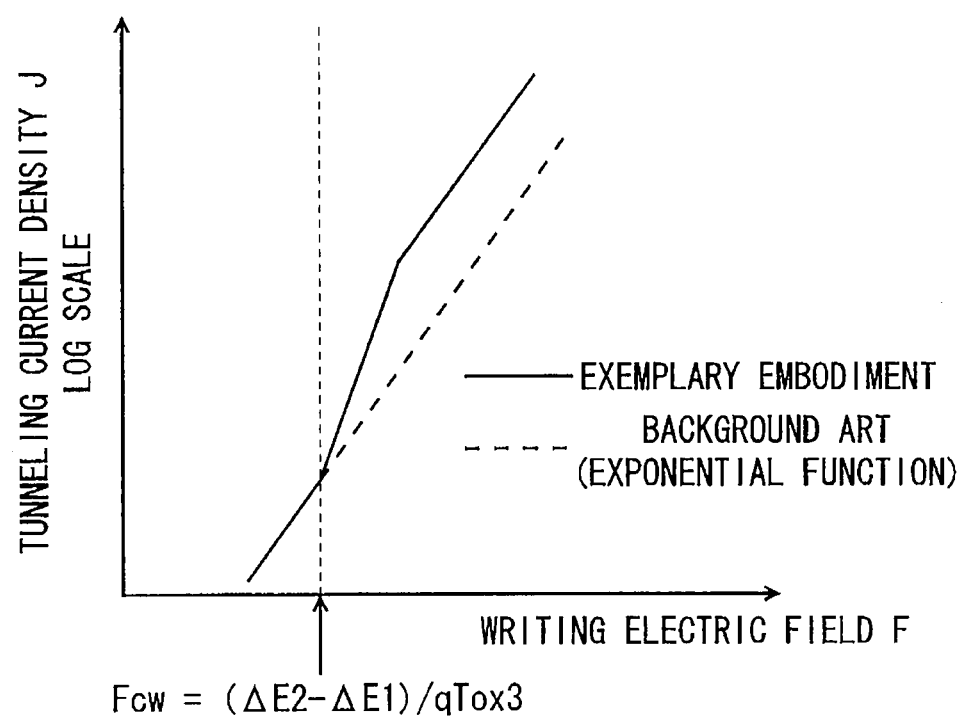
FIG. 4 is a graph for explaining the principle of operation of the semiconductor memory according to the first exemplary embodiment.

The semiconductor memory 200 can attain a large tunneling current increase rate to the tunneling electric field. When a tunneling electric field F is applied to a writing direction, energy of the third fine particle layer 280 becomes lower than that of the second fine particle layer 260 in a place where the tunneling electric field F satisfies $F_{cw}=(\Delta E_2-\Delta E_1)/(q \cdot T_{ox3})$ in which $F_{cw}$ shows an electric field, q shows the elementary electric charge, and $T_{ox3}$ shows the thickness of the third tunnel insulating film 270 (see FIG. 3C). When the tunneling electric field F exceeds $F_{cw}$, electrons located in the second fine particle layer 260 go out to the third fine particle layer 280 with lower energy and then go out to the charge storage film 300 with further lower energy. As a result, potential of the second fine particle layer 260 becomes lower, so that the height of the effective energy barrier at writing becomes lower with the electric field $F_{cw}$ as a boundary (see FIG. 3D). Accordingly, the tunneling current increases exponentially (FIG. 4). FIG. 4 shows the relation between the tunneling current density and the tunneling electric field F. The broken line shows the relation between the tunneling current density and the tunneling electric field F in the semiconductor memory 100 shown in FIG. 1A. The solid line shows the relation between the tunneling current density and the tunneling electric field F in this exemplary embodiment.

The semiconductor memory 200 can be improved in information retention without reduction in particle diameter of the conductive fine particles in the fine particle layers. Moreover, the rate of increase of the tunneling current to increase of the tunneling electric field can be made large.

Description has been made in the case where the thickness of each of the first tunnel insulating film 230, the second tunnel insulating film 250, the third tunnel insulating film 270 and the fourth tunnel insulating film 290 is 1 nm. However, if the thickness of each tunnel insulating film is not larger than the thickness 2 nm of a silicon oxide film so that a direct tunneling phenomenon occurs, a charge retention improving effect can be expected while high-speed writing/erasing is kept because the tunneling resistance of the oxide film itself is low. If the thickness of each tunnel insulating film is not larger than 1.5 nm, a further effect can be expected because the tunneling resistance of the oxide film itself is lower.

Figure 5:
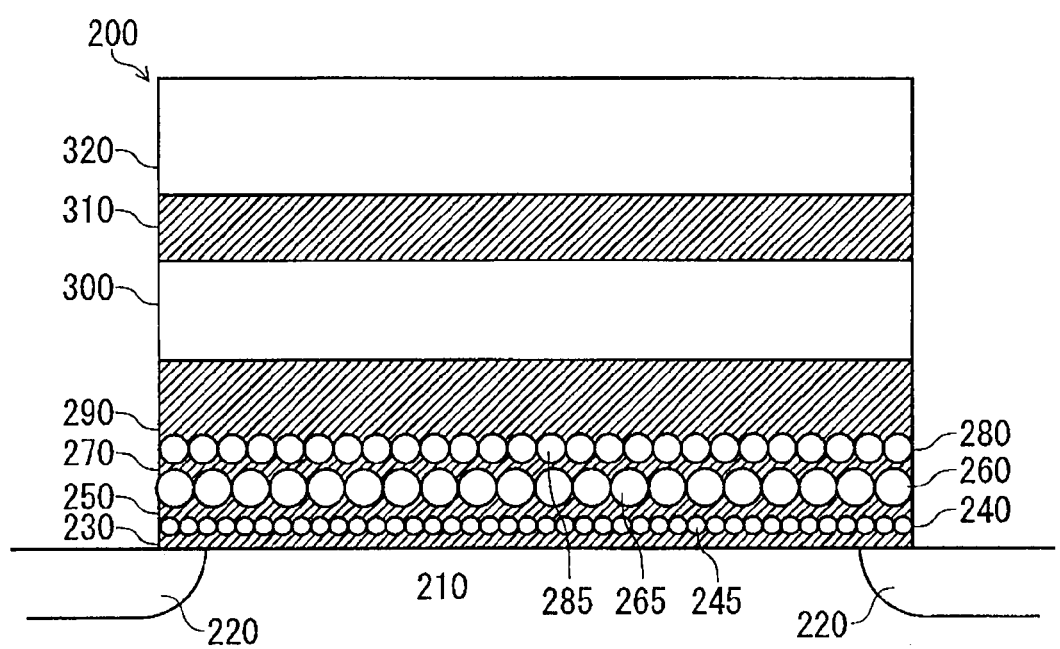
FIG. 5 is a view showing the semiconductor memory according to the first exemplary embodiment.
Figure 6A:
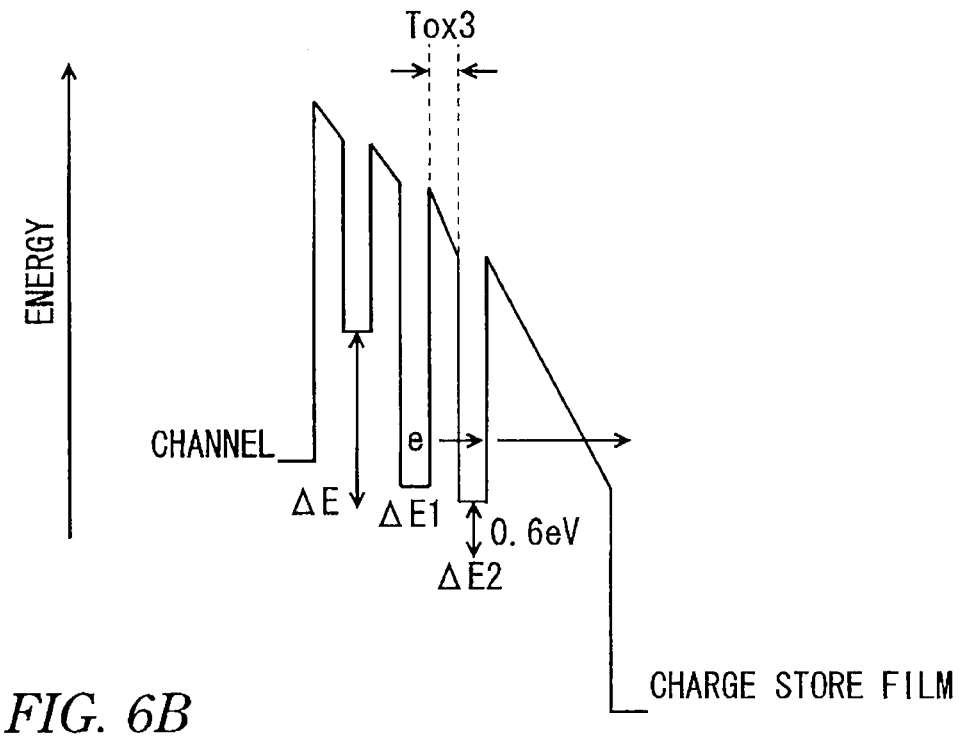
FIG. 6A is a view for explaining the principle of operation of the semiconductor memory according to the first exemplary embodiment.
Figure 6B:
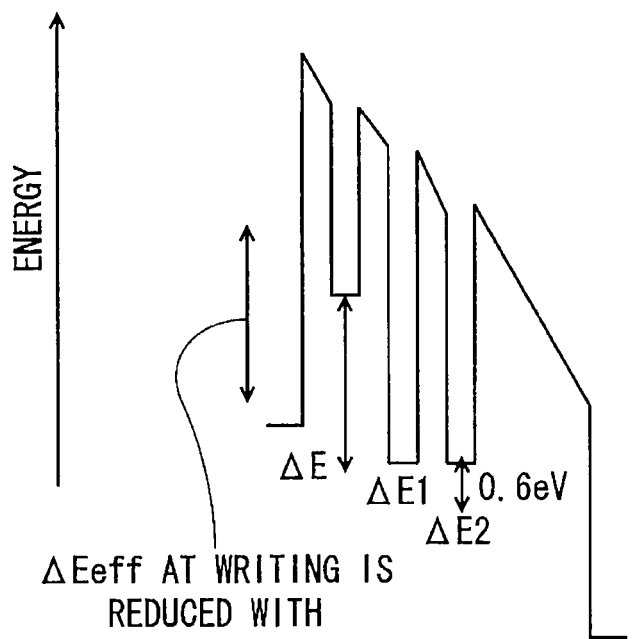
FIG. 6B is a view for explaining the principle of operation of the semiconductor memory according to the first exemplary embodiment.

The effect can be expected if the fourth tunnel insulating film 290 is thicker than 2 nm. FIG. 5 shows an example in which the fourth tunnel insulating film 290 is thick. On this occasion, the thickness of the fourth tunnel insulating film 290 is 4 nm. For example, the thick tunnel insulating film 290 can be formed in such a manner that fourth tunnel insulating films 290 are laminated by LPCVD. Even in this case, electrons remain in the second fine particle layer 260 after writing/erasing. Accordingly, the fact that the effective energy barrier becomes high when electric charge is held is the same as in the case described in FIGS. 3A to 3D. When the electric field F is applied to a writing direction, the energy of the third fine particle layer 280 becomes lower than that of the second fine particle layer 260 in a place where the electric field F satisfies $F_{cw}=(\Delta E_2-\Delta E_1)/(q \cdot T_{ox3})$ in the same way as in the case described in FIGS. 3A to 3D (see FIG. 6A). Accordingly, potential of the second fine particle layer 260 is reduced (see FIG. 6B). There are two reasons. The first reason is that electrons remaining in the second fine particle layer 260 go out to the third fine particle layer 280. The second reason is that electrons remaining in the second fine particle layer 260 partially go out to the charge storage film 300 with lower energy. Accordingly, the effective energy at writing decreases with $F_{cw}$ as a boundary, so that the tunneling current increases with $F_{cw}$ as a boundary as shown in FIG. 4.

A method of controlling remaining electrons in the semiconductor memory 200 will be described below.

Figure 7:
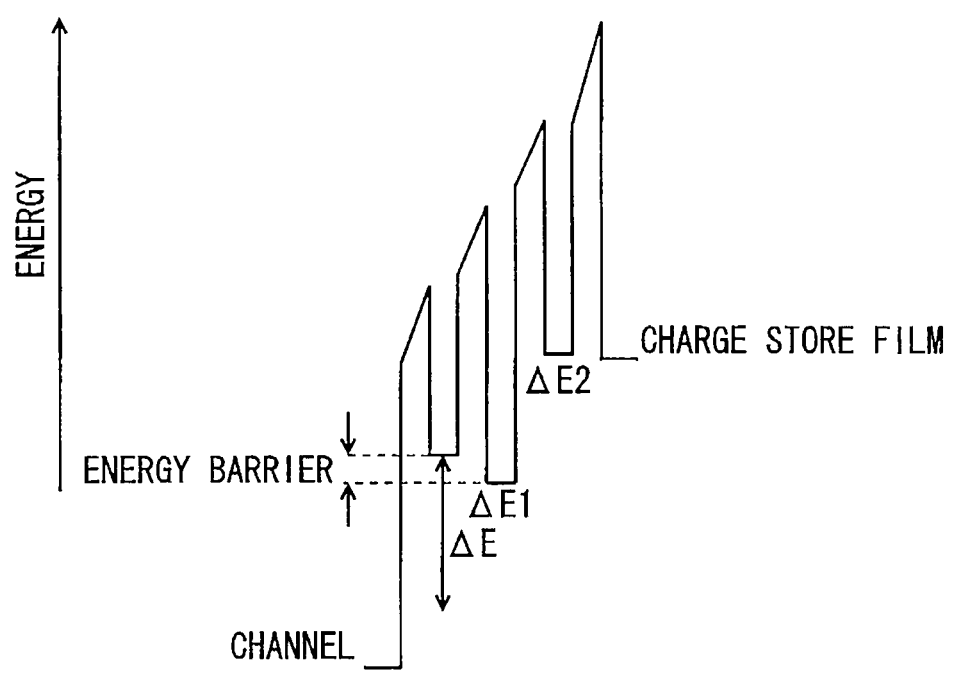
FIG. 7 is a view for explaining the principle of operation of the semiconductor memory according to the first exemplary embodiment.

When electrons tunnel from the charge storage film 300 to the channel region side by an erasing operation, the first fine particle layer 240 has the highest energy barrier. Therefore, when an appropriate erasing electric field is applied to the semiconductor memory 200 as shown in FIG. 7, an energy barrier can be formed between the second fine particle layer 260 and the first fine particle layer 240. Accordingly, when an erasing voltage and an erasing time are adjusted, electrons remaining in the second fine particle layer 260 can be controlled.

When, for example, the erasing voltage is applied in two steps, one for the principal purpose of implanting remaining electrons into the central silicon microcrystal layer and the other for the principal purpose of erasing the stored electrons, remaining electrons can be controlled more sufficiently after the erasing operation.

It is thought of that the writing voltage and the writing time can be adjusted to some degree to control electrons remaining after a writing operation. In this case, there is however a possibility that it will be more difficult to control remaining electrons because an energy barrier as shown in FIG. 7 is hardly formed at writing. When, for example, writing completion is determined by a plurality of stages provided in such a manner that a stage of applying a little the easily-remaining erasing-direction voltage shown in FIG. 7 for the purpose of implanting remaining electrons into the central silicon microcrystal layer is added just after voltage application for the principle purpose of writing if necessary, remaining electrons can be controlled more sufficiently after writing.

Incidentally, even in the configuration that the first fine particle layer 240 and the third fine particle layer 280 are replaced by each other, the voltage value and the voltage application time can be adjusted to control electrons remaining in the second fine particle layer 260.

The semiconductor memory 200 is suitable for raising the rate of increase of the tunneling current to the tunneling electric field in the writing direction because an energy barrier high on the channel region side is provided as shown in FIG. 7. This is because it is easy to control electrons remaining after an erasing operation as shown in FIG. 7.

On the other hand, a semiconductor memory having an energy barrier high on the charge storage film 300 side is suitable for raising the rate of increase of the tunneling current to the tunneling electric field in the erasing direction.

Second Exemplary Embodiment

Figure 8:
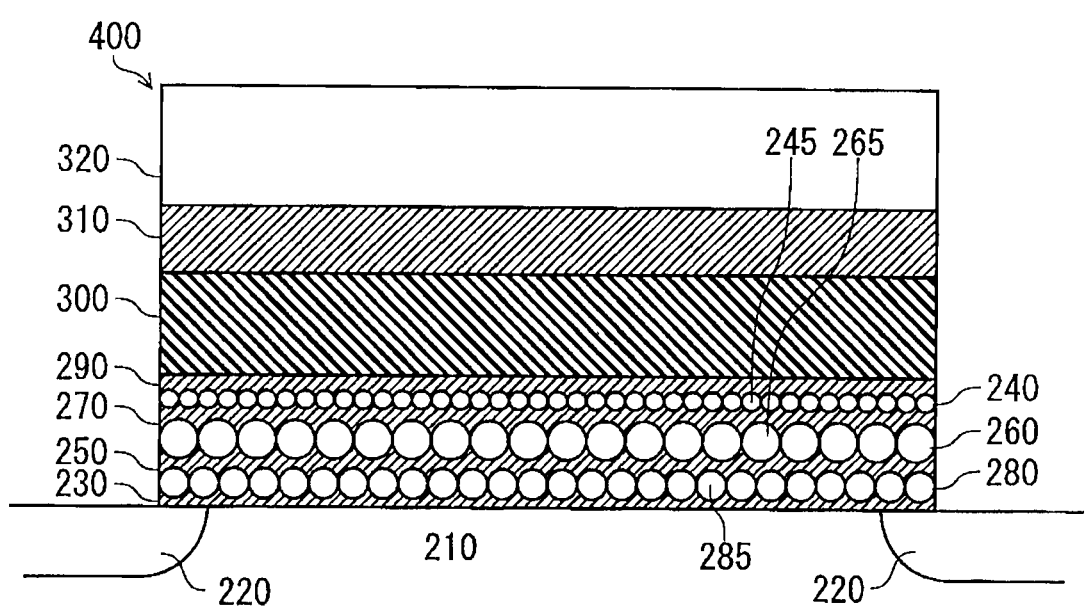
FIG. 8 is a view showing a semiconductor memory according to a second exemplary embodiment.

FIG. 8 shows a semiconductor memory 400 according to a second exemplary embodiment. The semiconductor memory 400 differs from the semiconductor memory 200 in that the first fine particle layer 240 and the third fine particle layer 280 are replaced by each other. MONOS (Metal Oxide Nitride Oxide Semiconductor) is assumed as the semiconductor memory 400.

A method of producing the semiconductor memory 400 will be described.

A thermally grown silicon oxide film 230 with a thickness ($T_{OX}$) of 1 nm is formed on a silicon substrate 210. A 2 nm-thick a-Si layer is deposited on the thermally grown silicon oxide film 230 by a CVD apparatus. Then, a thermally grown silicon oxide film 250 with a thickness of 1 nm is formed on a surface of the a-Si layer by thermal oxidation. As a result, the thickness of the a-Si layer becomes 1.5 nm, so that the a-Si layer is sandwiched between the 1 nm-thick silicon oxide films.

Then, the a-Si layer is annealed in a nitrogen atmosphere at a high temperature of 950° C. to thereby form a silicon layer 280 containing a group of silicon microcrystals with substantially the same thickness as the thickness of the a-Si layer. A 2.5 nm-thick a-Si layer is deposited on the thermally grown silicon oxide layer 250 by a CVD apparatus. Then, a 1 nm-thick silicon oxide film 270 is formed on a surface of the a-Si layer by thermal oxidation. As a result, the thickness of the a-Si layer becomes 2 nm, so that the a-Si layer is sandwiched between the 1 nm-thick silicon oxide films.

Then, the a-Si layer is annealed in a nitrogen atmosphere at a high temperature of 950° C. to thereby form a silicon layer 260 containing a group of silicon microcrystals with substantially the same thickness as the thickness 2 nm of the a-Si layer. A 1.5 nm-thick a-Si layer is deposited on the silicon layer 260 by a CVD apparatus. Then, a 1 nm-thick silicon oxide film 290 is formed on a surface of the a-Si layer by thermal oxidation. As a result, the thickness of the top a-Si layer becomes 1 nm, so that the top a-Si layer is sandwiched between the 1 nm-thick silicon oxide films.

Then, the top a-Si layer is annealed in a nitrogen atmosphere at a high temperature of 950° C. to thereby form a silicon layer 240 containing a group of silicon microcrystals with substantially the same thickness as the thickness 1.5 nm of the a-Si layer. Incidentally, the annealing condition in the nitrogen atmosphere can be adjusted to control the particle diameter of each of the silicon microcrystals 245, 265 and 285 to be substantially equal to the thickness of the a-Si layer. There are two reasons. The first reason is that the a-Si layer is too thin to allow horizontal crystal growth. The second reason is that silicon microcrystals have a tendency to hold a crystalline state in which surface energy is minimized.

Then, a silicon nitride film 300 (serving as a charge storage layer) with a thickness of 5 nm is formed on the silicon oxide layer 290 by LPCVD. Then, a silicon oxide film 310 with a thickness of 10 nm is formed thereon by LPCVD. An n+ polysilicon layer 320 (serving as a gate electrode) with a thickness of 200 nm is formed on the silicon oxide film 310 by CVD. Then, a resist pattern is used as a mask so that the n+ polysilicon layer 320 is shaped into a gate electrode. Then, phosphorus is implanted at incident energy of 5 KeV at a dose of $1\times10^{15}$ cm$^{-2}$ and annealing is performed at 1000° C. for 10 seconds to form an n+ layer 220 which serves as source/drain regions (see FIG. 8).

The principle of operation of the semiconductor memory 400 will be described.

FIGS. 9A to 9D are views for explaining the principle of operation of the semiconductor memory 400.

The energy barrier ΔE due to the Coulomb blockade effect and quantum confinement in conductive fine particles becomes high as the particle diameter of the conductive fine particles becomes small. Accordingly, $\Delta E_2$ of the third conductive fine particles 245 is the highest. ΔE of the first conductive fine particles 285 and $\Delta E_1$ of the second conductive fine particles 265 are smaller successively (see FIG. 9A). Because the second fine particle layer 260 has the lowest energy as described above, electrons remain in the second fine particle layer 260 after writing/erasing operation. At writing/erasing operation, electrons are taken in and out via the respective fine particle layers. For this reason, electrons located in the fine particle layers generally go out in pursuit of a lower energy state just after writing/erasing operation. For example, electrons located in the third fine particle layer 240 go out to the charge storage film 300 or the second fine particle layer 260.

Figure 9A:
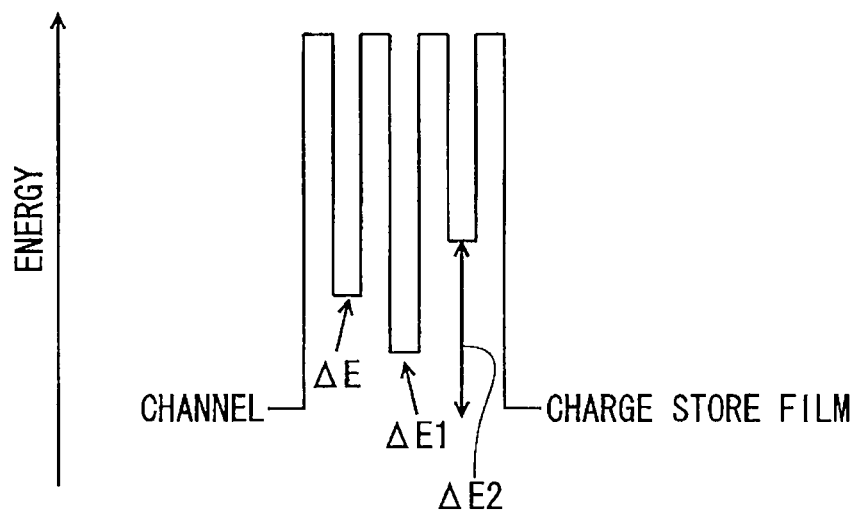
FIG. 9A is a view for explaining the principle of operation of the semiconductor memory according to the second exemplary embodiment.

However, in the state of FIG. 9A, electrons located in the second fine particle layer 260 are in a lower energy state than the energy state on both sides. Accordingly, electrons are located in the second fine particle layer 260 for a long term.

Figure 9B:
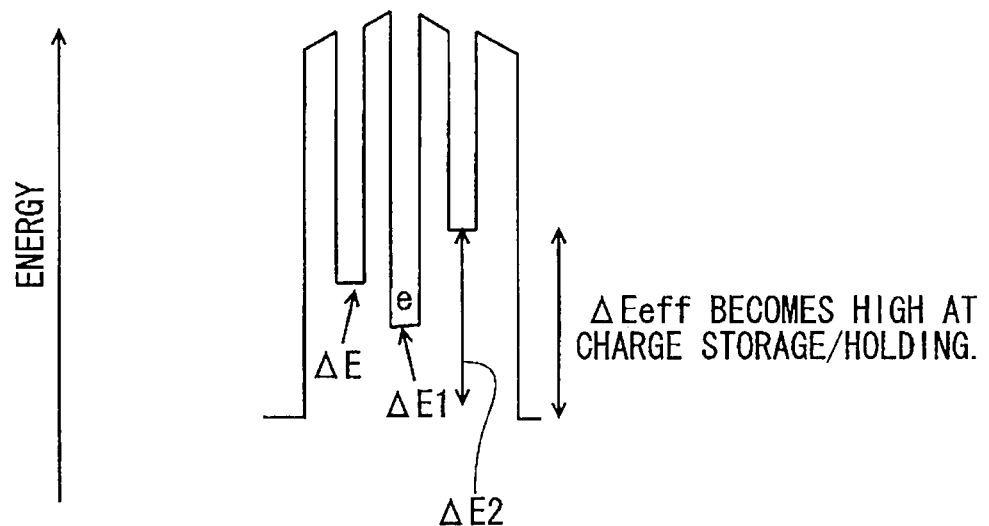
FIG. 9B is a view for explaining the principle of operation of the semiconductor memory according to the second exemplary embodiment.

As a result, potential of the second fine particle layer 260 increases as shown in FIG. 9B. Accordingly, the height of the energy barrier increases effectively when electric charge is remained. Accordingly, charge retention characteristic is improved exponentially without reduction in particle diameter of the conductive fine particles.

Figure 9C:
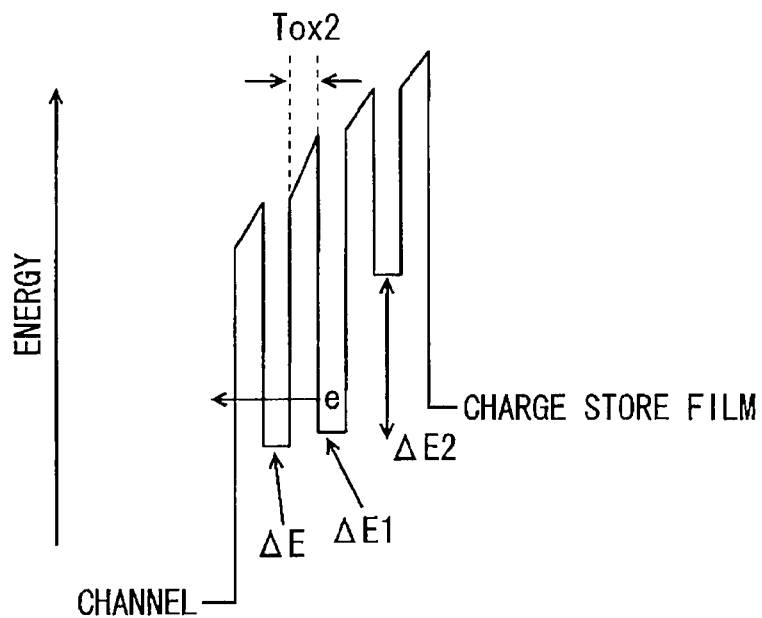
FIG. 9C is a view for explaining the principle of operation of the semiconductor memory according to the second exemplary embodiment.
Figure 9D:
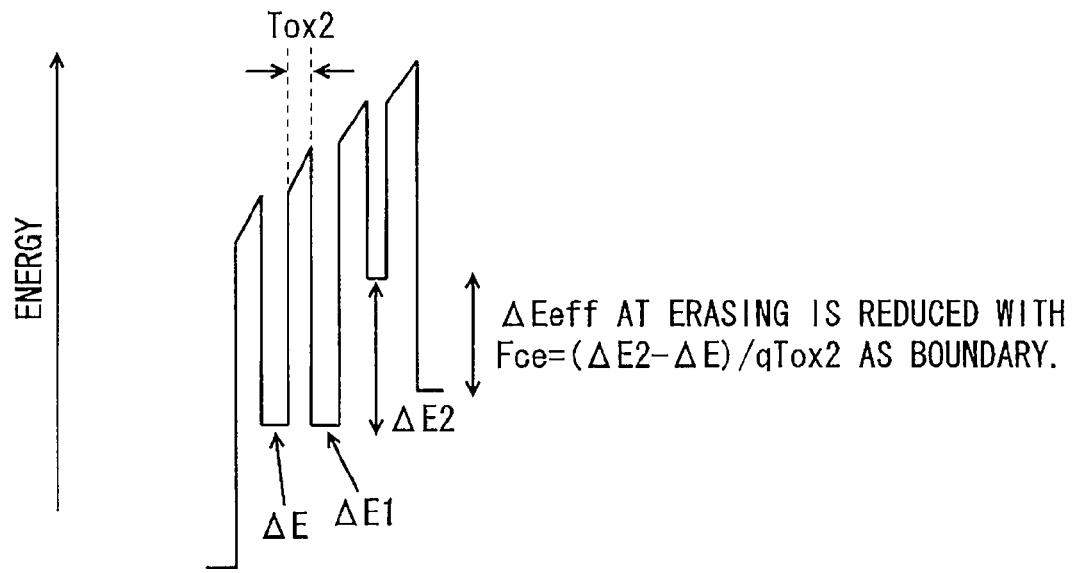
FIG. 9D is a view for explaining the principle of operation of the semiconductor memory according to the second exemplary embodiment.

A high increase rate of the tunneling current to increase of the tunneling electric field can be achieved. When a tunneling electric field F is applied to an erasing direction, energy of the first fine particle layer 280 becomes lower than that of the second fine particle layer 260 in a place where the electric field F satisfies $F_{ce}=(\Delta E-\Delta E_1)/(q \cdot T_{ox2})$ in which q shows the elementary electric charge, and $T_{ox2}$ shows the thickness of the second tunnel insulating film 250 (FIG. 9C).

When the electric field exceeds $F_{ce}$, electrons remaining in the second fine particle layer 260 go out to the first fine particle layer 280 with lower energy and then go out to the channel region side with further lower energy. As a result, potential of the second fine particle layer 260 becomes lower, so that the height of the effective energy barrier at erasing becomes lower (see FIG. 9D).

Figure 10:
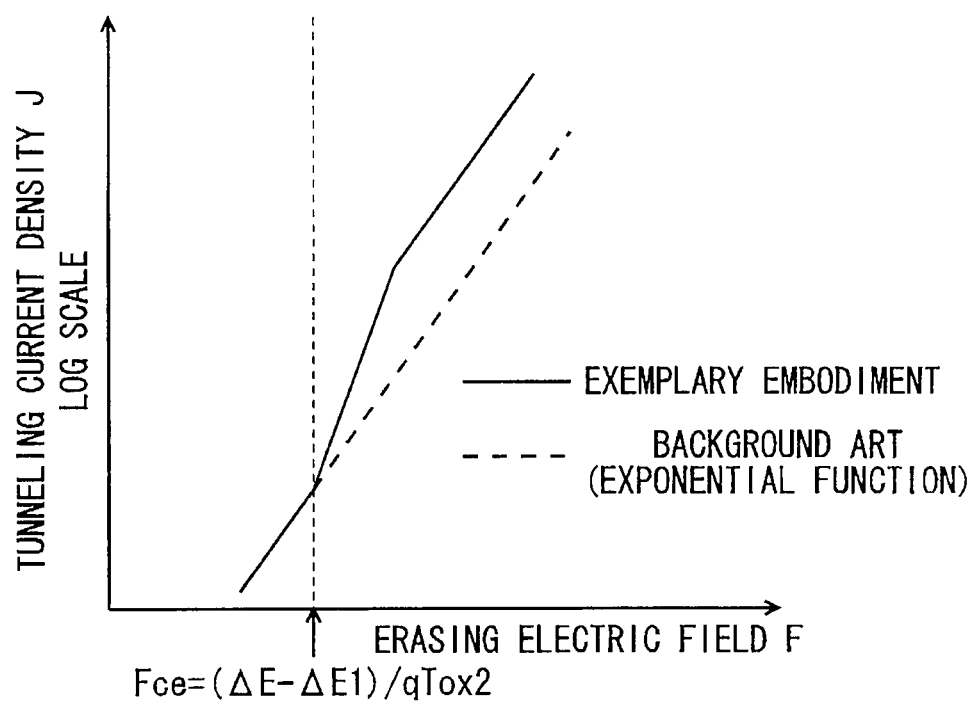
FIG. 10 is a graph for explaining the principle of operation of the semiconductor memory according to the second exemplary embodiment.

Accordingly, the tunneling current increases exponentially with respect to the erasing electric field F as shown in FIG. 10. Because the semiconductor memory 400 has an energy barrier high on the charge storage portion side as shown in FIG. 9A inversely with respect to the semiconductor memory 200 according to the first exemplary embodiment, the semiconductor memory 400 is suitable for increasing the rate of increase of the tunneling current to increase of the tunneling electric field in an erasing direction. This is because it is easy to control electrons remaining after writing operation, inversely with respect to the semiconductor memory 200.

The semiconductor memory 400 can be improved in charge retention characteristic without reduction in particle diameter of conductive microcrystals in the tunnel insulating films. Moreover, the semiconductor memory 400 is suitable for achieving a high rate of increase of the tunneling current to increase of the tunneling electric field. Particularly it is easy to eliminate erasing saturation caused by slow erasing in the MONOS structure. This is because it is easy to improve the tunneling current in the erasing direction.

The second exemplary embodiment has been described in the case where the thickness of each of the first tunnel insulating film 230, the second tunnel insulating film 250, the third tunnel insulating film 270 and the fourth tunnel insulating film 290 is 1 nm. However, if the thickness of each tunnel insulating film is not larger than 2 nm so that a direct tunnel phenomenon occurs, the effect can be expected.

Figure 11:
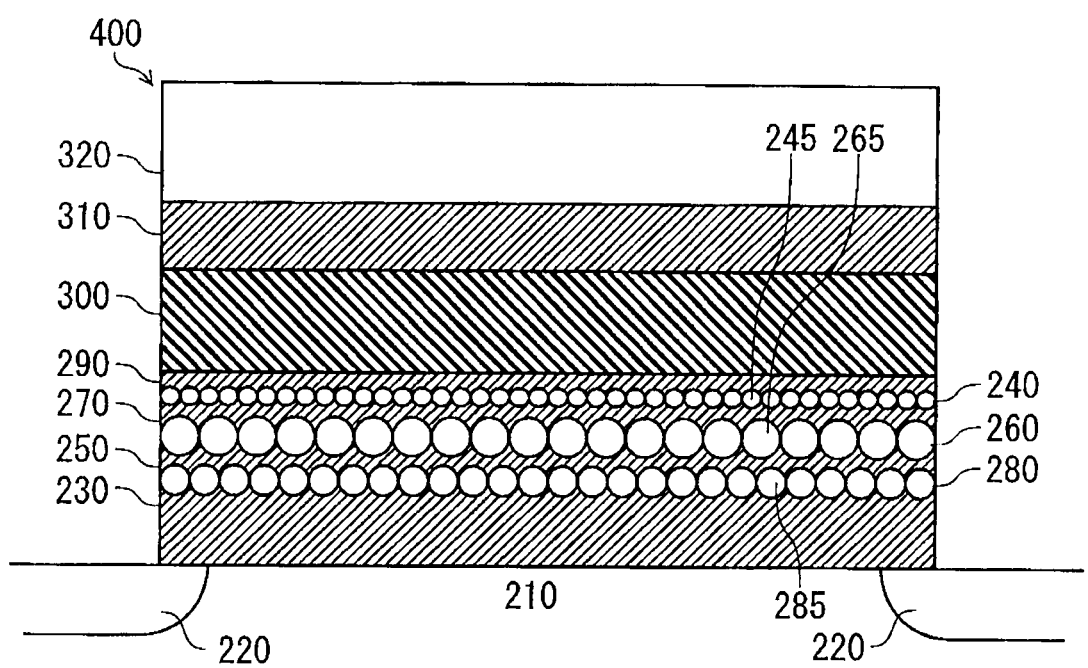
FIG. 11 is a view showing the semiconductor memory according to the second exemplary embodiment.

FIG. 11 is a view showing the case where the first tunnel insulating film 230 is thick. For example, the thickness of the first tunnel insulating film 230 is 3 nm. When, for example, the first tunnel insulating film 230 is a silicon oxide film, the 3 nm thick oxide can be formed in such a manner that the first tunnel insulating film 230 is made thick by thermal oxidation. Even in this case, electrons remain in the second fine particle layer 260 after writing/erasing operation. Accordingly, effective energy at erasing is reduced with the electric field F satisfying $F_{ce}=(\Delta E-\Delta E_1)/(q \cdot T_{ox2})$ as a boundary.

Figure 12:
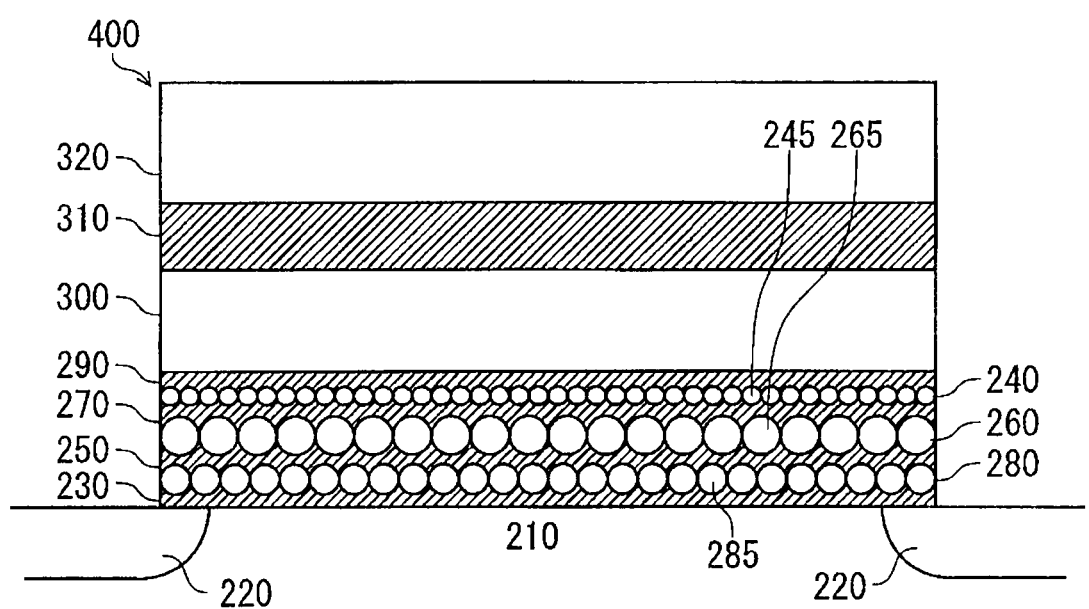
FIG. 12 is a view showing the semiconductor memory according to the second exemplary embodiment.

Incidentally, the charge storage film 300 may be replaced by a floating gate polysilicon as shown in FIG. 12.

Figure 13A:
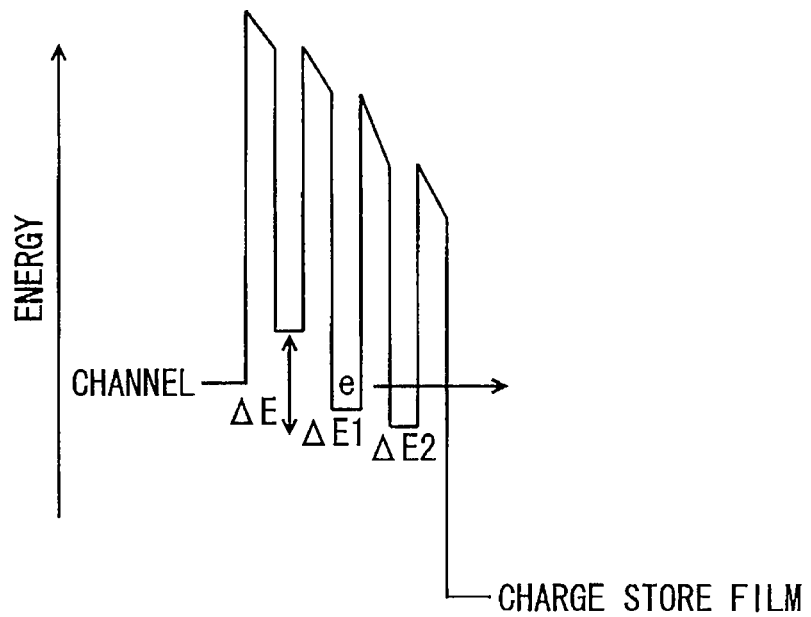
FIG. 13A is a view for explaining the principle of operation of the semiconductor memory according to the second exemplary embodiment.
Figure 13B:
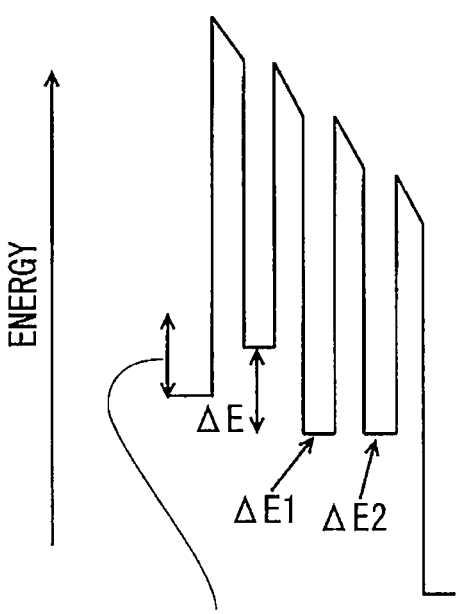
FIG. 13B is a view for explaining the principle of operation of the semiconductor memory according to the second exemplary embodiment.

Even in the semiconductor memory 400, if there are electrons remaining in the second fine particle layer 260 after erasing as shown in FIG. 9B, the remaining electrons go out to the third fine particle layer 280 and further go out to the charge storage film 300 when the electric field in the writing direction satisfies $F_{cw}=(\Delta E_2-\Delta E_1)/(q \cdot T_{ox3})$ as shown in FIG. 13A. Accordingly, as shown in FIG. 13B, potential of the second fine particle layer 260 is reduced so that the effective energy barrier at writing is lowered. Accordingly, even in the semiconductor memory 400, when electrons remaining in the second fine particle layer 260 after erasing are controlled, the tunneling current in the writing direction can be increased with $F_{cw}$ as a boundary as shown in FIG. 4. Electrons remaining after erasing operation can be controlled when completion of erasing/writing is determined based on the voltage value and the application time and, if necessary, a plurality of voltage application steps in the same manner as control of electrons remaining after writing in the first exemplary embodiment.

As described above, the semiconductor memory 400 can be improved in charge retention characteristic without reduction in particle diameter of conductive microcrystals in each tunnel insulating film, and a high rate of increase of the tunneling current to increase of the tunneling electric field can be achieved. This is because electrons can remain in the second fine particle layer 260 containing conductive fine particles with the largest particle diameter after writing/erasing operation.

Third Exemplary Embodiment

Figure 14:
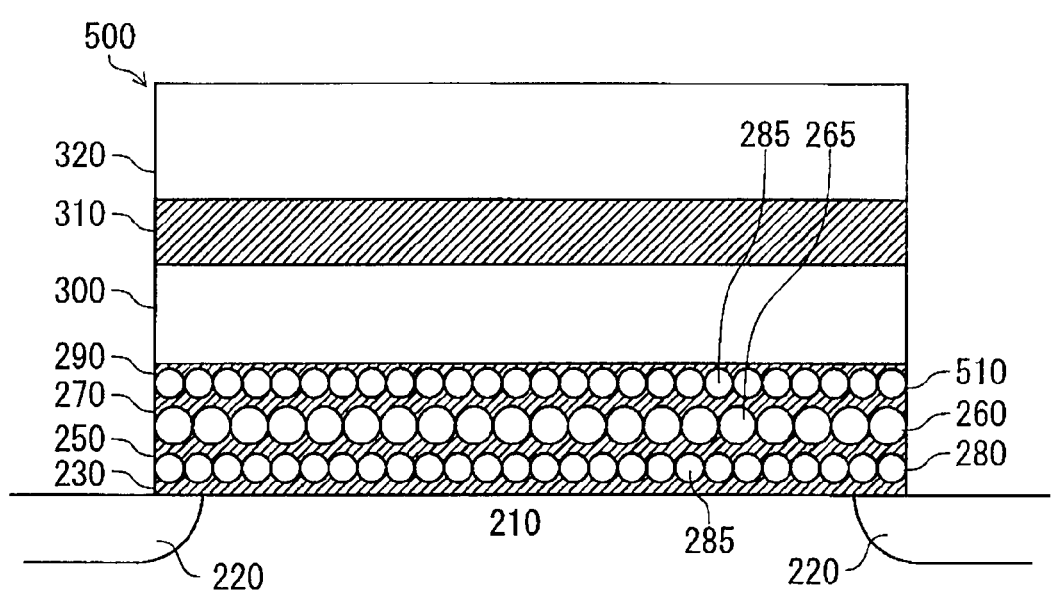
FIG. 14 is a view showing a semiconductor memory according to a third exemplary embodiment.

FIG. 14 shows a semiconductor memory 500 according to a third exemplary embodiment. The semiconductor memory 500 differs from the semiconductor memory 200 in that the particle diameter of the first fine particle layer 280 is equal to the particle diameter of the third fine particle layer 510. The third fine particle layer 510 contains first conductive fine particles 285. That is, the second fine particle layer 260 is sandwiched between two layers containing conductive fine particles 285 with the same particle diameter.

Figure 15A:
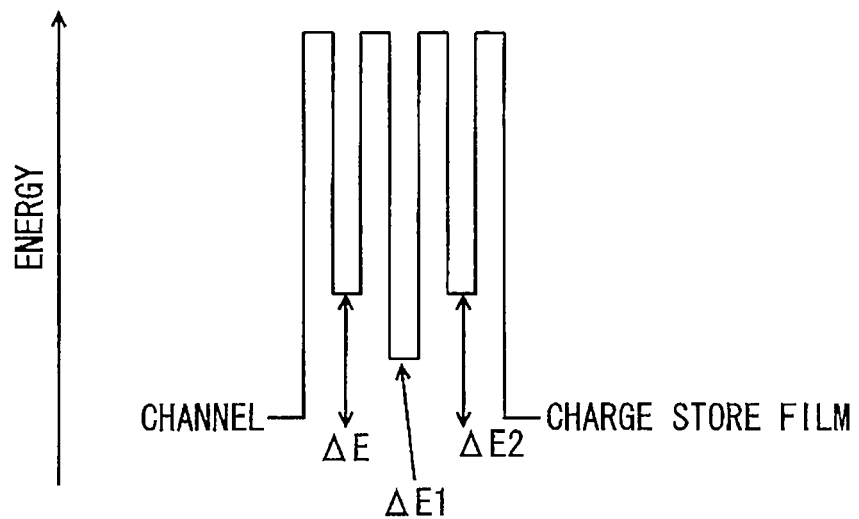
FIG. 15A is a view for explaining the principle of operation of the semiconductor memory according to the third exemplary embodiment.
Figure 15B:
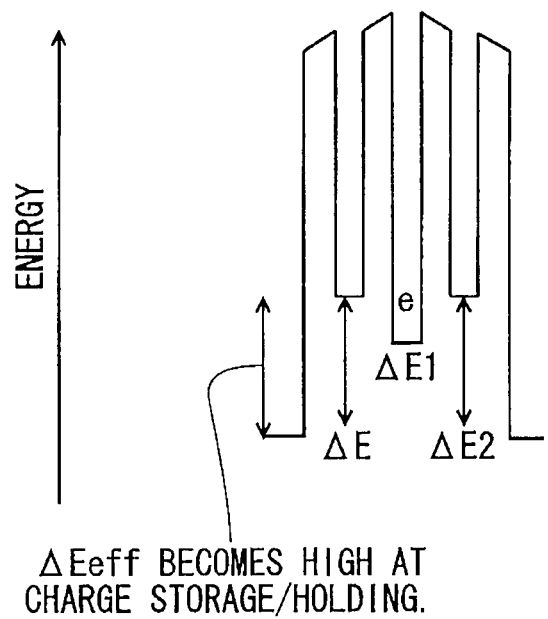
FIG. 15B is a view for explaining the principle of operation of the semiconductor memory according to the third exemplary embodiment.

In this case, energy barriers of the same height are formed on the channel region side and the charge storage film 300 side while a low energy barrier is located in the second fine particle layer 260 (see FIG. 15A). Because electrons can remain in the second fine particle layer 260 after writing/erasing operation, potential of the second fine particle layer 260 increases. As a result, charge retention characteristic can be improved exponentially (see FIG. 15B).

Figure 15C:
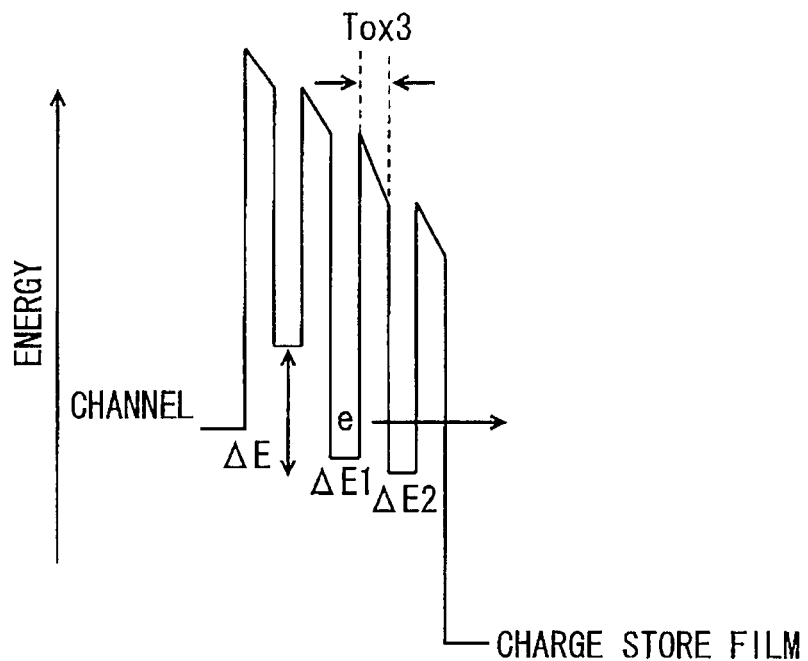
FIG. 15C is a view for explaining the principle of operation of the semiconductor memory according to the third exemplary embodiment.
Figure 15D:
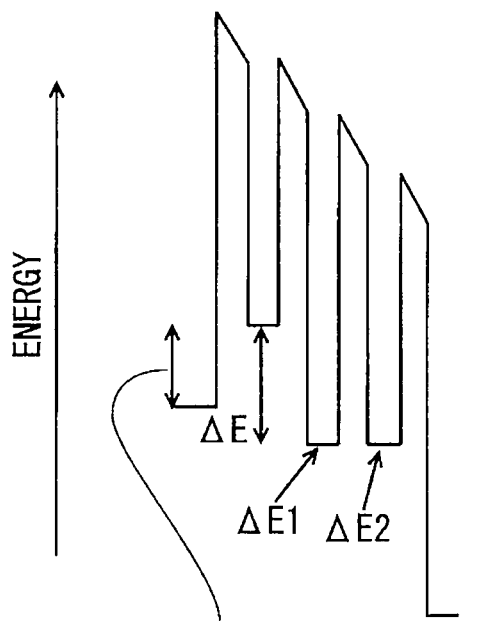
FIG. 15D is a view for explaining the principle of operation of the semiconductor memory according to the third exemplary embodiment.

The fact that the current for writing increases with the writing electric field $F_{cw}$ as a boundary (see FIGS. 15C and 15D) and the fact that the current for erasing increases with $F_{ce}$ as a boundary are the same as in the first and second exemplary embodiments. As for control of remaining electrons, the fact that remaining electrons can be controlled based on the writing/erasing voltage value and the application time and the fact that remaining electrons can be further controlled based on a plurality of voltage application steps if necessary are the same as in the first and second exemplary embodiments.

Description of Condition

The semiconductor memory according to the aforementioned exemplary embodiment uses energy levels formed by the carrier confinement effect in conductive fine particles inside tunnel insulating films. For example, the conductive fine particles are silicon nano-crystals.

That is, there is no quantum mechanical state in a range of the energy barrier $\Delta E$ due to conductive fine particles. Accordingly, for example, in the case of a charge retention state, electric charge has no byroad option but exceed over the energy barrier $\Delta E$. The semiconductor memory according to the aforementioned exemplary embodiment uses this principle.

This can be expressed effectively if the energy barrier $\Delta E$ due to conductive fine particles is higher than thermal fluctuation $k_B T$ (in which $k_B$ is the Boltzmann constant, T is an absolute temperature, and $k_B T$ is about 26 meV in room temperature). When the conductive fine particles are made of a metal material, $\Delta E$ depends on Coulomb blockade energy. When the conductive fine particles are made of a semiconductor material, $\Delta E$ depends on Coulomb blockade energy and quantum confinement energy.

The Coulomb blockade energy which is one of main factors is given as about $q/(2\pi \in d)$ if each conductive fine particle is shaped like a sphere or an approximate sphere. Here, d is the particle size (diameter) of each conductive fine particle, q is the elementary electric charge, and $\in$ is the dielectric constant of the tunnel insulating film material. This can be used for estimating a desired range of the particle diameter d of each conductive fine particle. It is preferable that the particle diameter d of each conductive fine particle used in the aforementioned exemplary embodiment satisfies $q/(2\pi \in d) > k_B T$, that is, $d < d_{max} = q/(2\pi \in k_B T)$. When the tunnel insulating film is a silicon oxide film, $d_{max}$ is equal to 30 nm.

An upper limit of the energy $\Delta E_1$ of the second fine particle layer 260 or a lower limit of the particle diameter $d_1$ of the second conductive fine particles 265 contained in the second fine particle layer 260 will be described below.

The energy $\Delta E_1$ is lower than the energy $\Delta E$ of the conductive fine particles on the channel region side and lower than the energy $\Delta E_2$ on the charge storage film side. This is because the particle diameter of the conductive fine particles contained in the second fine particle layer 260 is the largest. In this manner, both charge retention characteristic and tunneling current characteristic are improved.

When the relation $\min(\Delta E, \Delta E_2) - \Delta E_1 > k_B T$ is satisfied, $\Delta E_1$ functions effectively as a low energy level. Here, $\min(\Delta E, \Delta E_2)$ means smaller one of $\Delta E$ and $\Delta E_2$.

The relations $q/(2\pi \in d) - q/(2\pi \in d_1) > k_B T$ and $q/(2\pi \in d_2) - q/(2\pi \in d_1) > k_B T$ are obtained when d is the particle diameter of the first conductive fine particles 245, $d_2$ is the particle diameter of the third conductive fine particles 285, and $d_1$ is the particle diameter of the second conductive fine particles 265. The particle diameter $d_1$ of the second conductive fine particles 265 satisfies $d_1 > \max(d, d_2)/(1-k_B T/[q/\{2\pi\in\cdot\max(d, d_2)\}]) = \max(d, d_2)/(1-\max(d, d_2)/d_{max})$. Here, $\max(d, d_2)$ means larger one of d and $d_2$. When the tunnel insulating film is a silicon oxide film, $d_1 > \max(d, d_2)/[1-\max(d, d_2)/(30 \text{ nm})]$ is obtained based on $d_{max} = q/(2\pi\in k_B T) = 30$ nm.

The reason why the effect of the aforementioned exemplary embodiment is obtained is that the particle diameter of the second conductive fine particles 265 contained in the second fine particle layer 260 is the largest. That is, this is because remaining electrons are located in the second fine particle layer 260. However, when $\min(\Delta E, \Delta E_2)-\Delta E_1$ is equal to thermal fluctuation $k_B T = 26$ meV, remaining electrons are hardly located stably. That is, remaining electrons can be located stably when energy of the second fine particle layer 260 is low regardless of information charge quantity in the charge storage portion.

Although it is preferable from view of location of remaining electrons that energy of the second fine particle layer 260 is low even in charge retention, an electric field of the order of 1 [MV/cm] may be applied on the tunnel insulating film in charge retention based on increase of potential of the charge storage film due to information charge. For example, when an electric field of 1 [MV/cm] is applied on a silicon oxide film with a thickness of 1 nm, an energy difference of 0.1 eV is obtained. Accordingly, 26 meV which is lower than 0.1 eV is insufficient because energy of the second fine particle layer 260 is low in charge retention. Accordingly, it is further preferable that the energy difference between $\min(\Delta E, \Delta E_2)$ and $\Delta E_1$ is not lower than 0.1 eV.

That is, the relation $\Delta E_1 \leq \min(\Delta E, \Delta E_2)-0.1$ eV is obtained. The particle diameter $d_1$ satisfies $d_1 > \max(d, d_2)/[1-0.1 \text{ eV}/\{q/(2\pi\in\cdot\max(d, d_2))\}]$. For example, when the tunnel insulating film is a silicon oxide film, $d_1 > \max(d, d_2)/[1-\max(d, d_2)/(8.5 \text{ nm})]$ is obtained.

When the energy difference between $\min(\Delta E, \Delta E_2)$ and $\Delta E_1$ is not lower than 0.2 eV, energy of the second fine particle layer 260 becomes more stable even in charge retention. That is, the relation $\Delta E_1 \leq \min(\Delta E, \Delta E_2)-0.2$ eV is obtained. The particle diameter $d_1$ satisfies $d_1 > \max(d, d_2)/[1-0.2 \text{ eV}/\{q/(2\pi\in\cdot\max(d, d_2))\}]$. For example, when the tunnel insulating film is a silicon oxide film, $d_1 > \max(d, d_2)/[1-\max(d, d_2)/4 \text{ nm}]$ is obtained.

A lower limit of the energy $\Delta E_1$ of the second fine particle layer 260 or an upper limit of the particle diameter $d_1$ of the second conductive fine particles 265 contained in the second fine particle layer 260 will be described below. When the energy $\Delta E_1$ of the second conductive fine particles 265 is too low, it may be difficult to obtain a sufficient effect. That is, when the particle diameter of the second conductive fine particles 265 is infinitely large, the second fine particle layer 260 itself serves as a floating gate which stores electric charge. That is, it is necessary that an energy state of not higher than the thermal fluctuation energy 26 meV, which satisfactorily serves as a charge storage state, is not present in the second fine particle layer 260. That is, the energy $\Delta E_1$ has to satisfy the relation $\Delta E_1 > 26$ meV and the particle diameter $d_1$ has to satisfy the relation $d_1 < d_{max}$.

In addition, an electric field of the order of 1 [MV/cm] is applied even in charge retention. For example, when an electric field of 1 [MV/cm] is applied to a silicon oxide film with a thickness of 1 nm, an energy difference of 0.1 eV is obtained. Accordingly, when $\Delta E_1$ is 26 meV, an energy state of not higher than the thermal fluctuation energy 26 meV to serve as a charge storage state is present in the second fine particle layer 260. Accordingly, the relations $\Delta E_1 > 0.1$ eV and $d_1 < q/[2\pi\in\cdot(0.1 \text{ eV})]$ are obtained. For example, when the tunnel insulating film is a silicon oxide film, $d_1$ is smaller than 8.5 nm. Further preferably, the relations $\Delta E_1 > 0.2$ eV and $d_1 < q/[2\pi\in\cdot(0.2 \text{ eV})]$ are obtained. For example, when the tunnel insulating film is a silicon oxide film, $d_1$ is smaller than 4 nm.

It is preferable that the tunnel insulating film is as thin as possible. This is because writing/erasing operation can be performed at a high speed. In addition, in the aforementioned exemplary embodiment, the energy barrier becomes high as the size of the conductive fine particles becomes small. For this reason, charge retention characteristic can be improved sufficiently. When the thickness of the tunnel insulating film is not larger than 2 nm, the aforementioned effect of the exemplary embodiment can be obtained because the resistance of the oxide film itself is low. It is further preferable that the thickness of the tunnel insulating film is set to be not larger than 1.5 nm so that the resistance thereof becomes lower. The lower limit of the thickness of the tunnel insulating film can be set to be 0.3 nm which is an interatomic distance or 0.7 nm which is the thickness of a film naturally oxidized in the atmosphere. Incidentally, even when the thickness of the third tunnel insulating film 290 is increased as shown in FIG. 5, the tunneling current at writing can be increased. In addition, even when the thickness of the first tunnel insulating film 230 is increased as shown in FIG. 11, the tunneling current at erasing can be increased.

Each fine particle layer contains conductive fine particles. For this reason, each of the energy barriers $\Delta E$, $\Delta E_1$ and $\Delta E_2$ and the particle diameters d, $d_1$ and $d_2$ has a distribution of dispersion. Therefore, each of $\Delta E$, $\Delta E_1$, $\Delta E_2$, d, $d_1$ and $d_2$ is regarded as a mean value.

Each of d, $d_1$ and $d_2$ is regarded as a diameter on the assumption that each conductive fine particle is shaped like a sphere or an approximate sphere. However, each conductive fine particle is not always shaped like a sphere in the strict sense. When each conductive fine particle is shaped like a sphere, self-capacitance corresponding to the particle diameter d is $C_{self} = \pi\in d$. Accordingly, the Coulomb blockade energy is approximately given as $q/(2C_{self}) = q/(2\pi\in d)$. When each conductive fine particle is not like a sphere, an effective particle diameter d can be specified by $d = C_{self}/(\pi\in)$ based on self-capacitance $C_{self}$ determined in accordance with the shape of the conductive fine particle.

In the aforementioned exemplary embodiment, a silicon microcrystal layer obtained by heating a-Si is used. However, a silicon microcrystal layer may be formed directly by LPCVD at a high temperature. When silicon microcrystal surface density of the silicon nano-particle layer in the tunnel insulating film is too low, a sufficient effect cannot be expressed. The electrostatic shielding length of silicon is about 10 nm. Accordingly, when surface density on the channel region is not lower than 1 per $(20 \text{ nm})^2$ ($2.5 \times 10^{11}$ cm$^{-2}$), substantially all the surface of the channel region is affected by the silicon nano-crystal laminate structure without electrostatic shielding. Accordingly, the effect can be expected.

Description has been made in the case where a trap film such as a silicon nitride film or a floating gate such as polysilicon is taken as an example of the charge storage film. However, the charge storage film can be provided as silicon nano-crystals. In this case, it is preferable that the particle diameter of silicon nano-crystals in the charge storage film is larger than the particle diameter of any silicon nano-crystals in the tunnel insulating film. When silicon microcrystal surface density of the silicon nano-crystal layer in the charge storage film is too low, a sufficient effect cannot be expressed. The electrostatic shielding length of silicon is about 10 nm. Accordingly, when surface density on the channel region is not lower than 1 per 20 nm$^2$ ($2.5 \times 10^{11}$ cm$^{-2}$), substantially all the surface of the channel region is affected by the silicon nano-crystal laminate structure without electrostatic shielding. Accordingly, the effect can be expected.

As described above with reference to FIG. 4, in the semiconductor memory according to the aforementioned exemplary embodiment, the tunneling current at writing increases with $F_{cw}$ as a boundary. In connection with this, a range of the difference between $\Delta E_2$ and $\Delta E_1$ will be described. In an NAND flash memory, bit lines are electrically connected at writing/reading operation, even in semiconductor memory cells on non-selected word lines. For this reason, a plus gate voltage lower than the write voltage is applied to obtain a transfer state. It is preferable that the tunneling current is low to give an advantage to charge retention when tunnel field F is lower than the transfer state tunnel field but the tunneling current is high to give an advantage to writing when tunnel field F is higher than the transfer state tunnel field.

That is, when $F_{cw}$ shown in FIG. 4 is set to be not smaller than the transfer-state electric field, charge retention in less than the transfer-state electric field can be kept and the current at writing can be increased. The transfer-state stress gate electric field is from about 6 [MV/cm] to about 7 [MV/cm]. Accordingly, 6 [MV/cm]$\leq F_{cw} \leq$7 [MV/cm] or 6 [MV/cm] $\leq F_{cw}$ is preferred. Because there is a possibility that the stress gate electric field may be from about 5 [MV/cm] to about 8 [MV/cm], 5 [MV/cm]$\leq F_{cw} \leq$8 [MV/cm] or 5 [MV/cm]$\leq F_{cw}$ is further preferred. The value of $F_{cw}$ or $F_{ce}$ can be specified when the characteristic of the semiconductor memory is measured, actually writing/erasing characteristics.

Fourth Exemplary Embodiment

Figure 16:
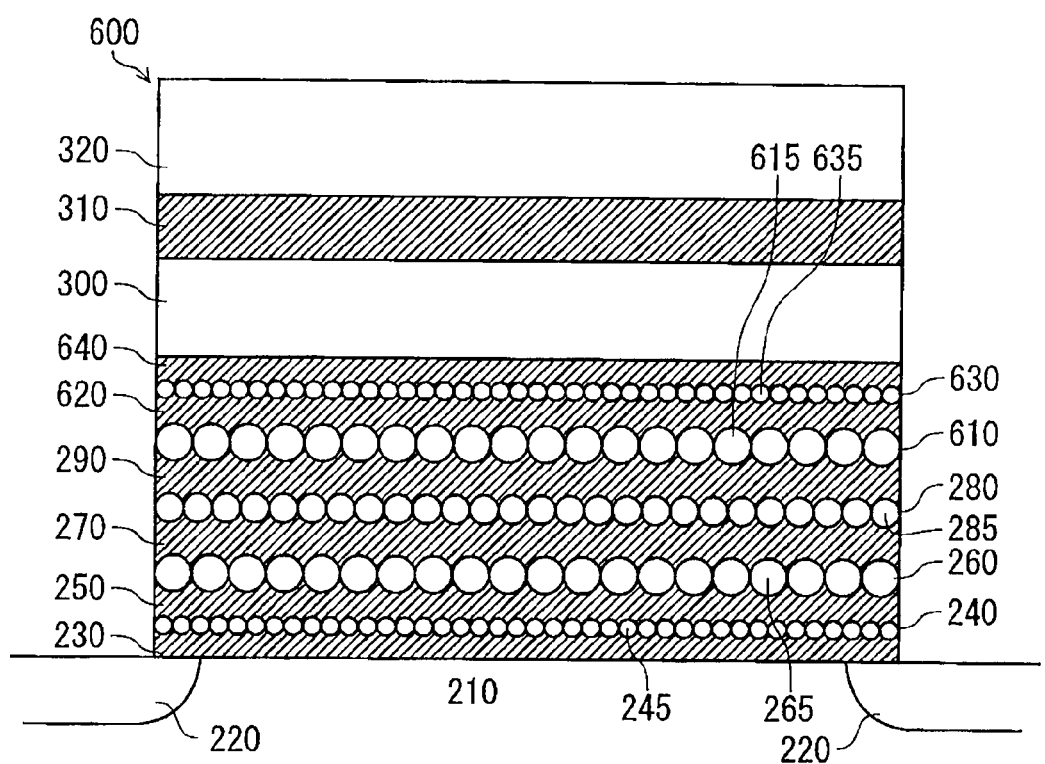
FIG. 16 is a view showing a semiconductor memory according to a fourth exemplary embodiment.

FIG. 16 shows a semiconductor memory 600 according to a fourth exemplary embodiment.

The semiconductor memory 600 differs from the semiconductor memory 200 in that a fourth fine particle layer 610, a fifth tunnel insulating film 620, a fifth fine particle layer 630 and a seventh tunnel insulating film 640 are formed successively on the fourth tunnel insulating film 290. The fourth fine particle layer 610 contains fourth conductive fine particles 615. The fifth fine particle layer 630 contains fifth conductive fine particles 635. Specifically, a silicon microcrystal layer 610 with a particle diameter of 2 nm, a silicon oxide film 620 with a thickness of 1 nm, a silicon microcrystal layer 630 with a particle diameter of 1 nm and a silicon oxide film 640 with a thickness of 1 nm are formed on the fourth tunnel insulating film 290.

The particle diameter of the fourth conductive fine particles 615 contained in the fourth fine particle layer 610 is larger than the particle diameter of the third conductive fine particles 285 contained in the third fine particle layer 280 and larger than the particle diameter of the fifth conductive fine particles 635 contained in the fifth fine particle layer 630. The particle diameter of the third conductive fine particles 285 is larger than the particle diameter of the fifth conductive fine particles 635.

The particle diameter of the second conductive fine particles 265 in the second fine particle layer 260 is the largest between the first fine particle layer 240 and the third fine particle layer 280 in the semiconductor memory 600. The particle diameter of the fourth conductive fine particles 615 in the fourth fine particle layer 610 is the largest between the third fine particle layer 280 and the fifth fine particle layer 630.

Accordingly, because electrons remain in the second fine particle layer 260 and the fourth fine particle layer 610, charge retention characteristic can be improved. Moreover, because remaining electrons go away from the second fine particle layer 260 toward the charge storage film 300 side at writing, the write current can be increased. On the other hand, because remaining electrons go away from the fourth fine particle layer 610 toward the channel region side at erasing, the erase current can be increased.

Thus, when the particle diameter of conductive fine particles in the central fine particle layer is the largest among the three fine particle layers, the effect of this exemplary embodiment can be obtained.

Although the aforementioned exemplary embodiment shows the case where silicon is used as the semiconductor substrate, another semiconductor may be used. Although the aforementioned exemplary embodiment shows the case where a silicon oxide film is used as each tunnel insulating film, the same effect as described above can be obtained even when another insulating material is used. Although the aforementioned exemplary embodiment shows the case where a silicon nitride film or n$^+$ polysilicon is used as the charge storage portion, another trap layer material containing a large number of carrier traps or another electrode material may be used. It is however preferable that the energy level of the charge storage portion is lower than the energy levels of any fine particle layers in the tunnel insulating films. If the energy level of the charge storage portion is higher than the energy level of some fine particle layer, the relative energy difference changes to give a disadvantage to charge retention so that a sufficient effect cannot be obtained. Although the aforementioned exemplary embodiment shows the case where a silicon oxide film is used as the block insulating film, another insulating film material may be used.

Although the aforementioned exemplary embodiment has been described while a tunnel insulating film containing silicon nano-crystals is taken as an example, the effect of this exemplary embodiment can be obtained even for another material conductive fine particles (referred to as conductive nano-particles) when the stacked layer structure and the particle diameter difference are designed in the same way. Each tunnel insulating film may exist between conductive fine particles contained in the fine particle layer.

Although the aforementioned exemplary embodiment shows the case where all the information charge supply source is a channel region, a gate electrode may be used as the information charge supply source. In this case, the tunnel insulating film is formed on the gate side of the charge storage film while the block insulating film is formed on the channel side of the charge storage film.

Although the several embodiments of the invention have been described above, they are just examples and should not be construed as restricting the scope of the invention. Each of these novel embodiments may be practiced in other various forms, and part of it may be omitted, replaced by other elements, or changed in various manners without departing from the spirit and scope of the invention. These modifications are also included in the invention as claimed and its equivalents.

What is claimed is:
1. A semiconductor memory comprising:
a semiconductor substrate having a channel region;
a first tunnel insulating film formed on the channel region of the semiconductor substrate;
a first fine particle layer formed on the first tunnel insulating film, the first fine particle layer comprising a plurality of first conductive fine particles that meet a Coulomb blockade condition;
a second tunnel insulating film formed on the first fine particle layer;

a second fine particle layer formed on the second tunnel insulating film, the second fine particle layer comprising a plurality of second conductive fine particles that meet the Coulomb blockade condition, wherein a mean particle diameter of the second conductive fine particles is larger than that of the first conductive fine particles;

a third tunnel insulating film formed on the second fine particle layer;

a third fine particle layer formed on the third tunnel insulating film, and wherein the second fine particle layer is between the first fine particle layer and the third fine particle layer, the third fine particle layer comprising a plurality of third conductive fine particles that meet the Coulomb blockade condition, wherein a mean particle diameter of the third conductive fine particles is smaller than that of the second conductive fine particles;

a fourth tunnel insulating film formed on the third fine particle layer;

a charge storage film formed on the fourth tunnel insulating film;

a block insulating film formed on the charge storage film; and a gate electrode formed on the block insulating film.

2. The semiconductor memory according to claim 1, wherein the second tunnel insulating film or the third tunnel insulating film is formed to have a tunneling resistance that is lower than that of a silicon oxide film having a thickness of 2 nm.

3. The semiconductor memory according to claim 1, wherein the first conductive fine particles, the second conductive fine particles and the third conductive fine particles are made of silicon nano-crystals.

4. The semiconductor memory according to claim 1, wherein the first to fourth tunnel insulating films are made of silicon oxide films.

5. The semiconductor memory according to claim 1, wherein
the first fine particle layer, the second particle layer and the third particle layer are formed to meet following relationship represented by $\min(\Delta E, \Delta E_2) - \Delta E_1 > k_B T$, wherein: $\Delta E_1$ is an average energy for charging one electron in the second fine particle layer; $\Delta E$ is an average energy for charging one electron in the first fine particle layer; $\Delta E_2$ is an average energy for charging one electron in the third fine particle layer; $k_B$ is a Boltzmann constant; and T (K) is a temperature.

6. The semiconductor memory according to claim 1, wherein
the first fine particle layer, the second particle layer and the third particle layer are formed to meet following relationship represented by:

$\min(\Delta E, \Delta E_2) - \Delta E_1 > 0.1 \text{eV}$; or $\min(\Delta E, \Delta E_2) - \Delta E_1 > 0.2 \text{eV}$, wherein: $\Delta E_1$ is an average energy for charging one electron in the second fine particle layer; $\Delta E$ is an average energy for charging one electron in the first fine particle layer; and $\Delta E_2$ is an average energy for charging one electron in the third fine particle layer.

7. The semiconductor memory according to claim 1, wherein
the first conductive fine particle, the second conductive particles and the third conductive particles are formed to meet following relationship represented by $d_1 > \max(d,d_2)/(1 - k_B T/[q/\{2\pi \in \cdot \max(d,d_2)\}])$, wherein: $d_1$ is the mean particle diameter of the second conductive fine particles; d is the mean particle diameter of the first conductive fine particles; $d_2$ is the mean particle diameter of the third conductive fine particles; $k_B$ is a Boltzmann constant; T (K) is a temperature; and q is an elementary electric charge.

8. The semiconductor memory according to claim 1, wherein
the first conductive fine particle, the second conductive particles and the third conductive particles are formed to meet following relationship represented by $d_1 > \max(d,d_2)/(1 - 0.1\text{eV}/[q/\{2\pi \in \cdot \max(d,d_2)\}])$; o $d_1 > \max(d,d_2)/(1 - 0.2\text{eV}/[q/\{2\pi \in \cdot \max(d,d_2)\}])$, wherein: $d_1$ is the mean particle diameter of the second conductive fine particles; d is the mean particle diameter of the first conductive fine particles; $d_2$ is the mean particle diameter of the third conductive fine particles; q is an elementary electric charge; and $\in$ is a dielectric constant of the first to third tunnel insulating films.

9. The semiconductor memory according to claim 1, wherein
the second particle layer and the third particle layer are formed to meet following relationship represented by $5[\text{MV/cm}] \leq (\Delta E_2 - \Delta E_1)/(q \cdot T_{ox3}) \leq 8[\text{MV/cm}]$, wherein: $\Delta E_1$ is an average energy for charging one electron in the second fine particle layer; $\Delta E_2$ is an average energy for charging one electron in the third fine particle layer; q is an elementary electric charge, and $T_{ox3}$ is a thickness of the third tunnel insulating film.

10. The semiconductor memory according to claim 1, wherein
the second particle layer and the third particle layer are formed to meet following relationship represented by $5[\text{MV/cm}] \leq (\Delta E_2 - \Delta E_1)/(q \cdot T_{ox3})$, wherein: $\Delta E_1$ is an average energy for charging one electron in the second fine particle layer; $\Delta E_2$ is an average energy for charging one electron in the third fine particle layer; q is an elementary electric charge, and $T_{ox3}$ is a thickness of the third tunnel insulating film.

* * * * *